United States Patent
Jang et al.

(10) Patent No.: US 10,627,672 B2
(45) Date of Patent: Apr. 21, 2020

(54) LED PACKAGE, BACKLIGHT UNIT AND ILLUMINATION DEVICE INCLUDING SAME, AND LIQUID CRYSTAL DISPLAY INCLUDING BACKLIGHT UNIT

(71) Applicant: SAMSUNG ELECTRONICS CO., LTD., Suwon-si, Gyeonggi-do (KR)

(72) Inventors: Eun Joo Jang, Suwon-si (KR); Hyun A Kang, Suwon-si (KR); Shin Ae Jun, Seongnam-si (KR); Oul Cho, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 347 days.

(21) Appl. No.: 15/271,902

(22) Filed: Sep. 21, 2016

(65) Prior Publication Data

US 2017/0082896 A1    Mar. 23, 2017

(30) Foreign Application Priority Data

Sep. 22, 2015  (KR) .......................... 10-2015-0134213
Sep. 21, 2016  (KR) .......................... 10-2016-0120986

(51) Int. Cl.
*G02F 1/1335* (2006.01)
*G02F 1/13357* (2006.01)
(Continued)

(52) U.S. Cl.
CPC ..... *G02F 1/133603* (2013.01); *C09D 133/02* (2013.01); *C09K 11/565* (2013.01);
(Continued)

(58) Field of Classification Search
CPC ......... H01L 33/507; H01L 2924/12041; H01L 33/58; H01L 2224/16145;
(Continued)

(56) References Cited

U.S. PATENT DOCUMENTS 7,084,435 B2    8/2006  Sugimoto et al.
7,824,937 B2 *  11/2010 Suehiro ................... H01L 33/56
                                                      257/E21.504
(Continued)

FOREIGN PATENT DOCUMENTS

CN    1465106 A    12/2003
CN    101459163 A   6/2009
(Continued)

OTHER PUBLICATIONS

Extended European Search Report dated Feb. 23, 2017, of the corresponding European Patent Application No. 16189953.9.
(Continued)

*Primary Examiner* — Hoan C Nguyen
(74) *Attorney, Agent, or Firm* — Cantor Colburn LLP

(57) ABSTRACT

A light emitting diode (LED) package includes: an LED; a stack structure including a light-scattering structure spaced apart from the LED, and a light conversion layer disposed on at least one surface selected from an inner surface and an outer surface of the light-scattering structure and configured to convert light emitted from the LED into white light, wherein the light conversion layer includes a semiconductor nanocrystal; and an organic barrier layer disposed on a surface of the light conversion layer.

39 Claims, 18 Drawing Sheets

(51) Int. Cl.

| | | |
|---|---|---|
| *C09K 11/70* | (2006.01) | |
| *C09K 11/88* | (2006.01) | |
| *C09K 11/56* | (2006.01) | |
| *C09D 133/02* | (2006.01) | |
| *G09F 9/33* | (2006.01) | |
| *H01L 33/50* | (2010.01) | |
| *H01L 33/58* | (2010.01) | |
| *H05B 33/08* | (2020.01) | |
| *F21Y 115/10* | (2016.01) | |
| *F21V 8/00* | (2006.01) | |
| *G09F 13/22* | (2006.01) | |
| *G02B 19/00* | (2006.01) | |

(52) U.S. Cl.
CPC ............ *C09K 11/70* (2013.01); *C09K 11/883* (2013.01); *G02F 1/133606* (2013.01); *G02F 1/133609* (2013.01); *G09F 9/33* (2013.01); *H01L 33/507* (2013.01); *F21Y 2115/10* (2016.08); *G02B 6/0073* (2013.01); *G02B 19/0066* (2013.01); *G02F 2001/133607* (2013.01); *G02F 2001/133614* (2013.01); *G02F 2202/36* (2013.01); *G09F 2013/222* (2013.01); *H01L 33/58* (2013.01); *H01L 2224/16145* (2013.01); *H01L 2224/48091* (2013.01); *H01L 2924/12041* (2013.01); *H01L 2933/0091* (2013.01); *H05B 33/0803* (2013.01); *H05K 2201/10106* (2013.01); *Y02B 20/181* (2013.01)

(58) Field of Classification Search
CPC ... H01L 2224/48091; H01L 2933/0091; H01L 2924/00014; G09F 9/33; G09F 2013/222; G02F 1/133603; G02F 1/133609; G02F 1/133606; G02F 2001/133607; G02F 2001/133614; G02F 2202/36; C09K 11/70; C09K 11/883; C09K 11/565; C09D 133/02; F21Y 2115/10; G02B 6/0073; G02B 19/0066; H05B 33/0803; Y02B 20/181
See application file for complete search history.

(56) References Cited

U.S. PATENT DOCUMENTS

| | | | |
|---|---|---|---|
| 9,170,350 B2 | 10/2015 | Jeong et al. | |
| 2004/0233536 A1* | 11/2004 | Ahn ...................... | A41D 25/00 359/599 |
| 2006/0175625 A1 | 8/2006 | Yokotani et al. | |
| 2008/0138538 A1* | 6/2008 | Lewis .................. | H01L 51/5253 428/1.1 |
| 2009/0152582 A1* | 6/2009 | Chang .................... | H01L 33/507 257/98 |
| 2010/0193806 A1* | 8/2010 | Byun ..................... | H01L 33/507 257/88 |
| 2011/0001159 A1* | 1/2011 | Nakamura ............. | B82Y 20/00 257/98 |
| 2011/0211334 A1 | 9/2011 | Kim | |
| 2012/0248479 A1* | 10/2012 | Anc ....................... | H01L 33/504 257/98 |
| 2013/0056706 A1 | 3/2013 | Baxter | |
| 2013/0099213 A1* | 4/2013 | Jun ........................ | C09K 11/02 257/40 |
| 2013/0148057 A1* | 6/2013 | Kang ................ | G02F 1/133524 349/64 |
| 2013/0168714 A1* | 7/2013 | Li ......................... | H01L 33/501 257/98 |
| 2013/0277643 A1 | 10/2013 | Williamson et al. | |
| 2013/0293123 A1 | 11/2013 | Deak et al. | |
| 2013/0326941 A1 | 12/2013 | Pickett et al. | |
| 2014/0021503 A1 | 1/2014 | Yoshida et al. | |
| 2014/0246689 A1 | 9/2014 | Luo et al. | |
| 2015/0003059 A1* | 1/2015 | Haitz ..................... | F21V 13/02 362/235 |
| 2015/0028365 A1 | 1/2015 | Kurtin et al. | |
| 2015/0188011 A1* | 7/2015 | Kang ...................... | H01L 33/60 257/98 |
| 2015/0236221 A1* | 8/2015 | Deak, Sr. ................ | C08G 18/10 315/185 R |
| 2016/0218252 A1* | 7/2016 | Steckel .................. | H01L 33/56 |
| 2017/0133561 A1* | 5/2017 | von Malm ............. | H01L 33/486 |

FOREIGN PATENT DOCUMENTS

| | | |
|---|---|---|
| CN | 103059393 A | 4/2013 |
| CN | 103456865 A | 12/2013 |
| JP | 2008159705 A | 7/2008 |
| KR | 101485889 B1 | 1/2015 |

OTHER PUBLICATIONS

Seth Coe-Sullivan, et al., "Quantum Dots for LED Downconversion in Display Applications", ECS Journal of Solid State Science and Technology, 2, 3026-3030, (2013).

Office Action dated Feb. 3, 2020, of the corresponding Chinese Patent Application No. 201610842472.0.

* cited by examiner

LED PACKAGE, BACKLIGHT UNIT AND ILLUMINATION DEVICE INCLUDING SAME, AND LIQUID CRYSTAL DISPLAY INCLUDING BACKLIGHT UNIT

CROSS REFERENCE TO RELATED APPLICATIONS

This application claims priority to and the benefit of Korean Patent Application Nos. 10-2015-0134213 and 10-2016-0120986, filed in the Korean Intellectual Property Office on Sep. 22, 2015 and Sep. 21, 2016, respectively and all the benefits accruing therefrom under 35 U.S.C. § 119, the content of which in its entirety is incorporated herein by reference.

BACKGROUND

1. Field

A light emitting diode (LED) package, and a backlight unit, and an illumination device including the same are disclosed. A liquid crystal display device including the backlight unit is also disclosed.

2. Description of the Related Art

Liquid crystal display ("LCD") devices form an image by receiving external light, unlike plasma display panels ("PDPs") and field emission displays ("FEDs") which form an image using self-emitting light. Thus, the LCD device includes a backlight unit on the rear side thereof for emitting light.

As a type of backlight unit for an LCD device, a cold cathode fluorescent lamp ("CCFL") has been used as a light source. However, the use of the CCFL as a light source may result in a lack of uniform luminance and may demonstrate deteriorated color purity when the LCD device has a larger screen.

Recently, a backlight unit which uses a light emitting diode ("LED") as a light source has been developed. An LED refers to a device emitting light when electrons and holes are encountered at an interface between a p-type and an n-type semiconductor material (i.e. a P—N semiconductor junction) during the application of a current.

The use of an LED as a backlight unit light source or as a general illumination device is presently receiving a lot of attention due to the many merits of an LED, such as a long life-span, a low power consumption rate, and a bright lighting despite being a small size.

SUMMARY

In one embodiment, an LED (light emitting diode) package is provided having a structure being capable of uniformly dispersing the light emitted from the LED light source, having improved color reproducibility and color purity and having high reliability as it is able to prevent the deterioration of semiconductor nanocrystal.

Another embodiment provides a backlight unit ("BLU") including the LED package.

Yet another embodiment provides an illumination device including the LED package.

Still another embodiment provides a liquid crystal display device including the backlight unit.

According to one embodiment, an LED package includes:
an LED;
a stack structure including
a light-scattering structure spaced apart from the LED, and
a light conversion layer disposed on at least one surface selected from an inner surface and an outer surface of the light-scattering structure and configured to convert light emitted from the LED into white light, wherein the light conversion layer includes a semiconductor nanocrystal; and
an organic barrier layer disposed on a surface of the light conversion layer.

The LED light source may be a blue light source or an ultraviolet (UV) light source.

The light-scattering structure may have a structure in a shape of a lens. The structure may have a concave lens shape or a convex lens shape.

The light-scattering structure may include glass or a polymer selected from polymethyl(meth)acrylate, polycarbonate, polyvinyl alcohol, an epoxy-containing polymer, a silicone polymer, and a combination thereof.

The light-scattering structure may have a transmittance of greater than or equal to about 80%.

The light scattering structure may include a polymer having a glass transition temperature (Tg) of greater than or equal to about 85° C.

The light-scattering structure may have a refractive index of greater than or equal to about 1.4.

The refractive indexes of the light-scattering structure, the light conversion layer, and the organic barrier layer may decrease sequentially as a distance between each layer and the LED increases.

The light-scattering structure may have a concavo-convex shape.

The light-scattering structure may be spaced apart from the LED light source by a distance of less than or equal to about 5 millimeters (mm).

The light conversion layer may be disposed on the outer surface of the light-scattering structure, and a refractive index of the light-scattering structure may be greater than a refractive index of the light conversion layer.

The light conversion layer may include a semiconductor nanocrystal and a matrix.

The semiconductor nanocrystal may have a full width at half maximum (FWHM) of less than or equal to about 45 nanometers (nm) in a photoluminance wavelength spectrum.

The semiconductor nanocrystal may be coated with a polymer including a carboxyl group or a salt thereof.

The polymer including a carboxyl group or a salt thereof may be at least one selected from poly(alkylene-co-acrylic acid), poly(alkylene-co-methacrylic acid), and a salt thereof.

The semiconductor nanocrystal may be coated with a polymer including a carboxylate anion group (—COO⁻) capable of binding to a surface of the semiconductor nanocrystal and a metal cation capable of binding to the carboxylate anion group, wherein the metal of the metal cation is different from a metal of the semiconductor nanocrystal.

The matrix may include a material selected from a silicone resin, an epoxy resin, a thiol-ene polymer, a (meth)acrylate-based polymer, silica, alumina, zinc oxide, zirconia, titania, and a combination thereof.

The light conversion layer may include a yellow semiconductor nanocrystal or a mixture of a red semiconductor nanocrystal and a green semiconductor nanocrystal.

The light conversion layer may further include an inorganic oxide particle. The inorganic oxide particle may be selected from silica, alumina, zinc oxide, zirconia, titania, and a combination thereof.

The LED package may further include a first inorganic barrier layer between the light conversion layer and the organic barrier layer.

The LED package may further include an organic barrier layer or an inorganic barrier layer on the outer surface of the light-scattering structure.

The LED package may further include a glass plate under the organic barrier layer.

The LED package may further include a metal pattern on at least one of an outer surface of the organic barrier layer and an outer surface of the light conversion layer.

The metal pattern may include at least one metal selected from aluminum (Al), nickel (Ni), silver (Ag), gold (Au), titanium (Ti), iron (Fe), copper (Cu), platinum (Pt), palladium (Pd), and tungsten (W).

The organic barrier layer may be disposed on the inner surface of the light-scattering structure, and the light conversion layer may be disposed between the light-scattering structure and the organic barrier layer and may fill a space inside of the light-scattering structure.

The LED package may further include a first inorganic barrier layer between the organic barrier layer and the light conversion layer.

The LED package may further include a second inorganic barrier layer between the light-scattering structure and the light conversion layer.

The first inorganic barrier layer and the second inorganic barrier layer may respectively include: at least one material selected from an inorganic oxide, an inorganic polymer, an organic/inorganic hybrid polymer, and a polymer including a first monomer having at least two thiol (SH) groups at a terminal end and a second monomer or oligomer comprising siloxane and having at least two carbon-carbon unsaturated bonds at a terminal end.

The organic barrier layer may have an oxygen transmission rate of greater than or equal to about $10^{-3}$ cubic centimeters per square meter per day ($cc/m^2/d$) and less than or equal to about $10^{-1}$ $cc/m^2/d$, and a moisture transmission rate of greater than or equal to about $10^{-3}$ $g/m^2/d$ and less than or equal to about $10^{-1}$ $g/m^2/d$.

The LED package may have a beam angle of greater than or equal to about 120°, for example greater than or equal to about 150°.

According to another embodiment, an LED package includes:
an LED;
a stack structure including
a light-scattering structure spaced apart from the LED, and
a light conversion layer disposed on an inner surface of the light-scattering structure and filling a space inside of the light-scattering structure, and which is configured to convert light emitted from the LED into white light, wherein the light conversion layer includes a semiconductor nanocrystal;
a first inorganic barrier layer under the light conversion layer; and
a glass plate under the first inorganic barrier layer.

The LED package may further include an adhesive layer disposed between the first inorganic barrier layer and the glass plate.

The LED package may further include an organic barrier layer or an inorganic barrier layer on an outer surface of the light-scattering structure.

The LED package may further include a metal pattern on at least one of an outer surface of the organic barrier layer and an outer surface of the light conversion layer.

The metal pattern may include a metal selected from aluminum (Al), nickel (Ni), silver (Ag), gold (Au), titanium (Ti), iron (Fe), copper (Cu), platinum (Pt), palladium (Pd), tungsten (W), and a combination thereof.

The LED package may further include a first inorganic barrier layer between the organic barrier layer and the light conversion layer.

The LED package may further include a second inorganic barrier layer between the light-scattering structure and the light conversion layer.

The first inorganic barrier layer and the second inorganic barrier layer may respectively include: a material selected from an inorganic oxide; an inorganic polymer; an organic/inorganic hybrid polymer; a polymer of a first monomer having at least two thiol (SH) groups at the terminal end and a siloxane-based second monomer or oligomer having at least two carbon-carbon unsaturated bonds at the terminal end; and a combination thereof.

The organic barrier layer may have an oxygen transmission rate of greater than or equal to about $10^{-3}$ $cc/m^2/d$ and less than or equal to about $10^{-1}$ $cc/m^2/d$, and a moisture transmission rate of greater than or equal to about $10^{-3}$ $g/m^2/d$ and less than or equal to about $10^{-1}$ $g/m^2/d$.

The LED package may have a beam angle of greater than or equal to about 120°, for example greater than or equal to about 150°.

Another embodiment provides a backlight unit ("BLU") including the LED package.

The backlight unit may further include a diffusion plate on the LED package.

Another embodiment provides an illumination device including the LED package.

Another embodiment provides a liquid crystal display device including the backlight unit and a liquid crystal panel configured to provide an image using light emitted from the backlight unit.

BRIEF DESCRIPTION OF THE DRAWINGS

The above and other aspects, advantages and features of this disclosure will become more apparent by describing in further detail exemplary embodiments thereof with reference to the accompanying drawings, in which.

DETAILED DESCRIPTION

Figure 1:
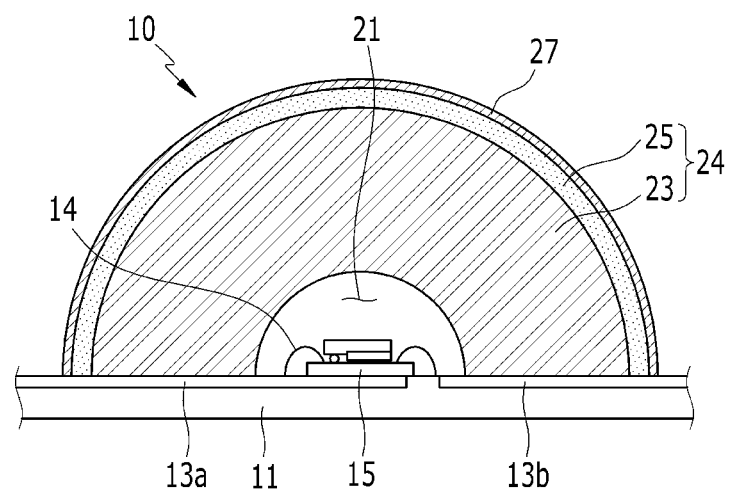
FIGS. 1 to 14 are schematic cross-sectional views of LED packages according to various embodiments.

The present disclosure will be described more fully hereinafter with reference to the accompanying drawings, in which example embodiments are shown. However, this disclosure may be embodied in many different forms, and is not construed as limited to the example embodiments set forth herein.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein. The terminology used herein is for the purpose of describing particular embodiments only and is not intended to be limiting. As used herein, the singular forms "a," "an," and "the" are intended to include the plural forms, including "at least one," unless the context clearly indicates otherwise. "At least one" is not to be construed as limiting to "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, the term "substituted" means that hydrogen of a compound or a substituent is replaced by at least one (e.g., 1, 2, 3, or 4) substituent independently selected from a C1 to C30 alkyl group, a C2 to C30 alkynyl group, a C6 to C30 aryl group, a C7 to C30 alkylaryl group, a C1 to C30 alkoxy group, a C6 to C30 aryloxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group, a thiol group, an ester group (—C(=O)OR, wherein R is a C1 to C6 alkyl group or a C6 to C12 aryl group), an acryloyl group, a methacyloyl group, a carboxyl group or a salt thereof, a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), and a combination thereof, provided that the substituted atom's normal valence is not exceeded.

As used herein, when a definition is not otherwise provided, the prefix "hetero" refers to a group that includes at least 1 (e.g. 1 to 4) heteroatoms, wherein the heteroatom is each independently one of N, O, S, Se, Si, or P.

Throughout the present disclosure, reference is made to various heterocyclic groups. Within such groups, the term "hetero" refers to a compound or group that comprises at least one heteroatom (e.g., 1 to 4 heteroatoms, each independently being N, O, S, Se, Si, or P) in a chain or at least one ring member that is a heteroatom (e.g., 1 to 4 heteroatoms, each independently being N, O, S, Se, Si, or P) in ring if the group is cyclic. In each instance, the total number of ring members may be indicated (e.g. a 3- to 10-membered heterocycloalkyl). If multiple rings are present, each ring is independently aromatic, saturated, or partially unsaturated, and multiple rings, if present, may be fused, pendant, or spirocyclic rings, or a combination thereof. Heterocycloalkyl groups include at least one non-aromatic ring that contains a heteroatom ring member. Heteroaryl groups include at least one aromatic ring that contains a heteroatom ring member. Non-aromatic and/or carbocyclic rings may also be present in a heteroaryl group, provided that at least one ring is both aromatic and contains a ring member that is a heteroatom.

As used herein, the term "alkylene group" refers to a straight or branched saturated aliphatic hydrocarbon group having a valence of at least two, (e.g. methylene (—$CH_2$—) or, propylene (—$(CH_2)_3$—), which may be optionally substituted with one or more substituents.

As used herein, the term "arylene group" refers to a group having a valence of two formed by removal of two hydrogen atoms from one or more rings of an aromatic hydrocarbon, wherein the hydrogen atoms may be removed from the same or different rings, each of which may be an aromatic ring or a non-aromatic ring. The arylene group may be optionally substituted with one or more substituents.

As used herein, the term "aliphatic organic group" refers to a saturated or unsaturated, linear or branched hydrocarbon group. The aliphatic organic group may be a C1 to C30 linear or branched alkyl group.

The term "aromatic organic group" refers to an organic group comprising at least one unsaturated cyclic group having delocalized pi electrons. The term encompasses both hydrocarbon aromatic groups and heteroaromatic groups. For example, the aromatic organic group may be a C6 to C30 aryl group or a C2 to C30 heteroaryl group.

The term "alicyclic organic group" refers to a cyclic group having properties of an aliphatic group. The alicyclic group may be a cycloalkyl, cycloalkenyl, or cycloalkynyl. For example, the alicyclic organic group may be a C3 to C30 cycloalkyl group, a C3 to C30 cycloalkenyl group, or a C3 to C30 cycloalkynyl group. For example, the alicyclic organic group may include a heteroatom selected from N, O, S, Se, Si, and P. The term "heterocyclic group" may include a cycloalkyl group, a cycloalkenyl group, or a cycloalkynyl group.

As used herein, the term "combination thereof" refers to a mixture, a stacked structure, a composite, an alloy, a blend, or a reaction product of components.

As used herein, "(meth)acrylate" refers to acrylate and/or methacrylate.

Semiconductor nanocrystals (quantum dots) may be employed for a light conversion material of a backlight unit, and the backlight unit may have high color purity and excellent color reproducibility. However, since the semiconductor nanocrystals have a low thermal stability, they are easily deteriorated when exposed to an LED light source, and as a result, may unfavorably deteriorate the reliability of the device.

In order to solve the problems associated with the use of quantum dots as light conversion materials, a structure has been suggested in which a space is disposed to separate the light conversion layer including a semiconductor nanocrystal from the LED light source. However, this type of structure also has demerits in that light emitted from the LED light source is hardly uniformly dispersed, and exothermic control is difficult.

By using the semiconductor nanocrystals as a light conversion layer, one embodiment provides an LED package having a structure capable of uniformly dispersing the light emitted from the LED light source, and having improved color reproducibility and color purity with high reliability due to its ability to prevent the deterioration of the semiconductor nanocrystals.

An LED package according to an embodiment includes:
an LED;
a stack structure including
a light-scattering structure spaced apart from the LED, and
a light conversion layer disposed on at least one surface selected from an inner surface and an outer surface of the light-scattering structure and configured to convert light emitted from the LED into white light, wherein the light conversion layer includes a semiconductor nanocrystal; and
an organic barrier layer disposed on a surface of the light conversion layer.

The organic barrier layer may not be in contact with the light-scattering structure.

Hereinafter, with reference to drawings, an LED package according to an embodiment is described.

FIG. 1 is a schematic view of an LED package 10 according to an embodiment.

Referring to FIG. 1, an LED package 10 includes an LED as a light source 15, a first lead electrode 13a, and a second lead electrode 13b on a substrate 11, and the LED 15 is electrically connected with both the first lead electrode 13a and the second lead electrode 13b through a wire 14. A stack structure 24 is spaced apart from the LED 15, wherein the stack structure 24 includes a light-scattering structure 23 and a light conversion layer 25, and an organic barrier layer 27 is disposed on the outer surface of the light conversion layer 25.

The substrate 11 may be made of at least one transparent material such as alumina (aluminum oxide), zirconia (zirconium dioxide), quartz, calcium zirconate, zinc oxide (ZnO), gallium nitride (GaN), silicon carbide (SiC), and aluminum nitride (AlN), but is not limited thereto.

The LED 15 may be a blue light emitting light source or an ultraviolet (UV) light emitting light source as a light emitting element.

The stack structure 24 includes the light-scattering structure 23 and the light conversion layer 25, and surrounds the periphery of the LED light source 15 while being spaced apart from the LED light source 15. The light conversion layer 25 is spaced apart from the LED light source 15 by the light-scattering structure 23 in order to prevent or reduce degradation of semiconductor nanocrystals by the LED light source 15.

The light-scattering structure 23 may have a hemispherical lens-shaped structure as shown in FIG. 1. The lens-shaped structure may be a convex lens-shaped structure as shown in FIG. 1. The light-scattering structure 23 widely diffuses light emitted from the LED light source 15, and may widen a beam angle of a backlight unit or an illumination device including the light-scattering structure 23. In addition, a number of LED used to provide uniform surface light may be reduced and a volume of the backlight unit or the illumination device may also be reduced.

The light-scattering structure 23 may be made of glass or a polymer selected from polymethyl(meth)acrylate, polycarbonate, polyvinyl alcohol, an epoxy-containing polymer, a silicone polymer, or a combination thereof.

The light-scattering structure 23 may have transmittance of greater than or equal to about 80%, for example greater than or equal to about 85%, for example greater than or equal to about 90%. The light-scattering structure 23 having the above levels of transmittance may effectively transmit light emitted from the LED 15 to the light conversion layer 25.

The polymer constituting the light-scattering structure 23 may have a glass transition temperature (Tg) of greater than or equal to about 85° C., for example greater than or equal to about 90° C., for example greater than or equal to about 100° C., and less than or equal to about 150° C., for example less than or equal to about 130° C., for example less than or equal to about 120° C. When the polymer has a glass transition temperature within this range, preparation of the light-scattering structure 23 may be easily performed.

The light-scattering structure 23 including the polymer may have a refractive index of greater than or equal to about 1.4, for example greater than or equal to about 1.5, and the refractive index may be less than or equal to about 1.7, for example less than or equal to about 1.6. For example, the polymer may have a refractive index of greater than or equal to about 1.5 and less than or equal to about 1.7, for example greater than or equal to about 1.4 and less than or equal to about 1.6, or for example greater than or equal to about 1.5 and less than or equal to about 1.6. In addition, the light-scattering structure 23 including the polymer may have a higher refractive index than the light conversion layer 25. In this case, when light emitted from the LED 15 travels through the light-scattering structure 23 having a relatively high refractive index and enters the light conversion layer 25 having a relatively low refractive index, the light path may be controlled to concentrate the light within a predetermined range through the difference in refractive index.

The light-scattering structure 23 may be disposed a distance away from the LED such that a space 21 is formed between the LED and the light-scattering structure. A distance between the LED light source 15 and the light-scattering structure may be a distance of less than or equal to about 5 millimeters (mm), for example, about 0.01 mm to about 5 mm, for example, about 0.01 mm to about 3 mm, or for example, about 0.05 mm to about 1 mm.

The light-scattering structure 23 is in direct contact with a portion of the substrate 11.

The light-scattering structure 23 may be obtained by injection molding the polymer or glass. The obtained light-scattering structure 23 may have a concavo-convex shape. The concavo-convex shape may be formed when forming the light-scattering structure 23. In addition, the surface of the obtained light-scattering structure 23 may be textured to provide a concavo-convex shape. The texturing may be performed through mechanical polishing or chemical etching. The light-scattering structure 23 having the concavo-convex shape may play a role of diffusing light emitted therefrom.

The light conversion layer 25 is formed on the outer surface of the light-scattering structure 23. The light conversion layer 25 includes a semiconductor nanocrystal and a matrix to accomplish color reproducibility and color purity.

The space 21 between the light-scattering structure 23 and the LED 15 may be void or filled with a transparent polymer. The transparent polymer may include a matrix of the light conversion layer 25, which will be described later.

Since the light conversion layer 25 and the LED 15 are spaced apart from each other, the semiconductor nanocrystal present in the light conversion layer 25 is also spaced apart from the LED 15 by a predetermined distance, so as to prevent degradation of the semiconductor nanocrystal. The intensity of the light source supplied to the light conversion layer 25 may be reduced to about $\frac{1}{1000}$ of the total amount of light emitted from the LED 15 due to the presence of the light-scattering structure 23.

The semiconductor nanocrystal may be selected from a Group II-VI compound, a Group III-V compound, a Group IV-VI compound, a Group IV element, a Group IV compound, and a combination thereof. Herein, Group II, Group III, Group IV, Group V, and Group VI refer to Groups 2 and 12, Group 13, Group 14, Group 15, Group 16 according to the IUPAC Periodic Table.

The Group II-VI compound may be selected from a binary element compound selected from CdSe, CdTe, ZnS, ZnSe, ZnTe, ZnO, HgS, HgSe, HgTe, MgSe, MgS, and a mixture thereof; a ternary element compound selected from CdSeS, CdSeTe, CdSTe, ZnSeS, ZnTeSe, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof. The Group III-V compound may be selected from a binary element compound selected from GaN, GaP, GaAs, GaSb, AlN, AlP, AlAs, AlSb, InN, InP, InAs, InSb, and a mixture thereof; a ternary element compound selected from GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a mixture thereof; and a quaternary element compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The Group IV-VI compound may be selected from a binary element compound selected from SnS, SnSe, SnTe, PbS, PbSe, PbTe, and a mixture thereof; a ternary element compound selected from SnSeS, SnSeTe, SnSTe, PbSeS, PbSeTe, PbSTe, SnPbS, SnPbSe, SnPbTe, and a mixture thereof; and a quaternary element compound selected from SnPbSSe, SnPbSeTe, SnPbSTe, and a mixture thereof. The Group IV element may be selected from Si, Ge, and a mixture thereof. The Group IV compound may be a binary element compound selected from SiC, SiGe, and a mixture thereof.

The Group III-V compound may further include a Group II element. Example of such a compound may include InZnP, but are not limited thereto.

The binary element compound, the ternary element compound, or the quaternary element compound respectively are present in a uniform concentration within each particle or in a partially different concentration within each particle.

The semiconductor nanocrystal particle may have a core-shell structure wherein a first semiconductor nanocrystal is surrounded by a second semiconductor nanocrystal that is different from the first semiconductor nanocrystal. An interface between the core and the shell may have a concentration gradient wherein the concentration of an element of the shell decreases toward the core. The core may include at least two semiconductor nanocrystals. The shell may be a multi-shell including at least two shells and each shell may include at least two semiconductor nanocrystals.

Examples of the first semiconductor nanocrystal may include one of CdSe, CdS, ZnTe, ZnSe, ZnS, InP, InZnP, InAs, GaN, GaP, and a mixture thereof and examples of the second semiconductor nanocrystal may include one of CdS, ZnSe, ZnSeS, ZnS, GaN, and a mixture thereof.

For example, a red semiconductor nanocrystal having a light emitting wavelength of about 605 nm to about 650 nm, for example about 610 nm to about 640 nm and a green semiconductor nanocrystal having a light emitting wavelength of about 510 nm to about 545 nm, for example about 520 nm to about 545 nm may be used. Examples of red semiconductor nanocrystal may include at least one of CdSe/ZnS, CdSe/CdS/ZnS, CdSe/CdS/ZnSeS, InP/ZnS, InP/ZnSeS/ZnS, and InP/ZnSe/ZnS, and examples of green semiconductor nanocrystal may include at least one of CdSeS/ZnS, CdZnSeS/CdS/ZnS, CdZnSe/ZnSe/ZnS, InZnP/ZnS, InGaP/ZnS, InZnP/ZnSeS/ZnS, and InP/ZnSe/ZnS.

The semiconductor nanocrystal may have a full width at half maximum (FWHM) of less than or equal to about 45 nanometers (nm), for example less than or equal to about 40 nm, or less than or equal to about 30 nm, in a light emitting (photoluminance) wavelength spectrum. Within the above ranges, color purity or color reproducibility of the light conversion layer 25 may be improved.

The semiconductor nanocrystal may have a particle diameter (e.g., corresponding to the longest dimension for a non-spherically shaped particle) of about 1 nm to about 100 nm, for example about 1 nm to about 50 nm, about 1 nm to about 10 nm, or about 2 nm to about 25 nm.

The shape of the semiconductor nanocrystal may have a shape that is widely used in the art and is not particularly limited. For example, the shape of the semiconductor nanocrystal may include spherical, pyramidal, multi-armed, or cubic nanoparticles, nanotubes, nanowires, nanofibers, nanoplate particles, a combination thereof, or the like.

The semiconductor nanocrystal is dispersed in a matrix.

The matrix may include a material selected from a silicone resin, an epoxy resin, a thiol-ene polymer, a (meth) acrylate-based polymer, silica (silicon dioxide), alumina (aluminum oxide), zinc oxide, zirconia (zirconium oxide), titania (titanium dioxide), and a combination thereof.

For example, the thiol-ene polymer may be prepared by polymerizing a first monomer including at least two thiol (—SH) groups at a terminal end and a second monomer including at least two carbon-carbon unsaturated bonds at a terminal end.

The first monomer including at least two thiol (—SH) groups at the terminal end of the thiol-ene polymer may be represented by Chemical Formula 1.

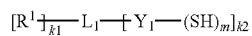

Chemical Formula 1

In Chemical Formula 1, $R^1$ is selected from hydrogen; a substituted or unsubstituted C1 to C30 alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a substituted or unsubstituted C2 to C30 alkenyl group; a substituted or unsubstituted C2 to C30 alkynyl group; a substituted or unsubstituted C3 to C30 alicyclic organic group having a double bond or a triple bond; a substituted or unsubstituted C3 to C30 heterocyclic group having a double bond or a triple bond; a C3 to C30 alicyclic organic group substituted with a C2 to C30 alkenyl group or a C2 to C30 alkynyl group; a C3 to C30 heterocycloalkyl group substituted with a C2 to C30 alkenyl group or a C2 to C30 alkynyl group; a hydroxy group; $NH_2$; a substituted or unsubstituted C1 to C30 amine group (—NRR', wherein R and R' are independently hydrogen or a C1 to C20 alkyl group); an isocyanate group; an isocyanurate group; a (meth)acrylate group; a halogen; —ROR' (wherein R is a substituted or unsubstituted C1 to C20 alkylene group and R' is hydrogen or a C1 to C20 alkyl group); an acyl halide group (—RC(=O)X, wherein R is a substituted or unsubstituted alkylene group and X is a halogen); —C(=O)OR' (wherein R' is hydrogen or a C1 to C20 alkyl group); —ON; or —C(=O)NRR' (wherein R and R' are independently hydrogen or a C1 to C20 alkyl group), $L_1$ is selected from a single bond; a substituted or unsubstituted C1 to C30 alkylene group; a substituted or unsubstituted C6 to C30 arylene group; a substituted or unsubstituted C3 to C30 heteroarylene group; a substituted or unsubstituted C3 to C30 cycloalkylene group; or a substituted or unsubstituted C3 to C30 heterocycloalkylene group, $Y_1$ is selected from a single bond; a substituted or unsubstituted C1 to C30 alkylene group; a substituted or unsubstituted C2 to C30 alkenylene group; and a C1 to C30 alkylene group or a C2 to C30 alkenylene group wherein at least one methylene (—$CH_2$—) is replaced by a sulfonyl group (—S(=O)$_2$—), a carbonyl group (C(=O)), an ether group (—O—), a sulfide group (—S—), a sulfoxide group (—S(=O)—), an ester group (—C(=O)O—), an amide group (—C(=O)NR—) (wherein R is hydrogen or a C1 to C10 alkyl group), or —NR— (wherein R is hydrogen or a C1 to C10 alkyl group), or a combination thereof, m is an integer of greater than or equal to 1, k1 is an integer of 0 or greater than or equal to 1, k2 is an integer of greater than or equal to 1, and the sum of m and k2 is an integer of 3 or more.

In an embodiment, in Chemical Formula 1, m does not exceed the valence of $Y_1$, and the sum of k1 and k2 does not exceed the valence of $L_1$. In another embodiment, the sum of m and k2 may be 3 to 6, for example 3 to 5, and in another embodiment, m may be 1, k1 may be 0, and k2 may be 3 or 4. The thiol group is bound to the terminal end of $Y_1$, for example when $Y_1$ is an alkylene group, the thiol group may be bound to the terminal carbon.

The second monomer of the thiol-ene polymer may be represented by Chemical Formula 2.

Chemical Formula 2

In Chemical Formula 2,

X is a C2 to C30 aliphatic organic group having a carbon-carbon double bond or a carbon-carbon triple bond, a C6 to C30 aromatic organic group having a carbon-carbon double bond or a carbon-carbon triple bond, or a C3 to C30 alicyclic organic group having a carbon-carbon double bond or a carbon-carbon triple bond, $R^2$ is selected from hydrogen; a substituted or unsubstituted C1 to C30 alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a substituted or unsubstituted C2 to C30 alkenyl group; a substituted or unsubstituted C2 to C30 alkynyl group; a substituted or unsubstituted C3 to C30 alicyclic organic group having a double bond or a triple bond; a substituted or unsubstituted C3 to C30 heterocyclic group having a double bond or a triple bond; a C3 to C30 alicyclic organic group substituted with a C2 to C30 alkenyl group or a C2 to C30 alkynyl group; a C3 to C30 heterocycloalkyl group substituted with a C2 to C30 alkenyl group or a C2 to C30 alkynyl group; a hydroxy group; $NH_2$; a substituted or unsubstituted C1 to C30 amine group (—NRR', wherein R and R' are independently hydrogen or a C1 to C30 alkyl group); an isocyanate group; an isocyanurate group; a (meth)acrylate group; a halogen; —ROR' (wherein R is a substituted or unsubstituted C1 to C20 alkylene group and R' is hydrogen or a C1 to C20 alkyl group); an acyl halide group (—RC(=O)X, wherein R is a substituted or unsubstituted alkylene group and X is a halogen); —C(=O)OR' (wherein R' is hydrogen or a C1 to C20 alkyl group); —CN; or —C(=O)NRR' (wherein R and R' are independently hydrogen or a C1 to C20 alkyl group), $L_2$ is selected from a single bond, a substituted or unsubstituted C1 to C30 alkylene group, a substituted or unsubstituted C6 to C30 arylene group, or a substituted or unsubstituted C3 to C30 heteroarylene group, $Y_2$ is selected from a single bond; a substituted or unsubstituted C1 to C30 alkylene group; a substituted or unsubstituted C2 to C30 alkenylene group, a C1 to C30 alkylene group, or a C2 to C30 alkenylene group wherein at least one methylene (—CH$_2$—) is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—) (wherein R is hydrogen or a C1 to C10 alkyl group), or —NR— (wherein R is hydrogen or a C1 to C10 alkyl group), or a combination thereof, and n is an integer of greater than or equal to 1, k3 is an integer of 0 or greater than or equal to 1, k4 is an integer of greater than or equal to 1, and the sum of n and k4 is an integer of greater than or equal to 3.

In an embodiment, in Chemical Formula 2, n does not exceed the valence of $Y_2$, and the sum of k3 and k4 does not exceed the valence of $L_2$. In an embodiment, the sum of n and k4 may be 3 to 6, for example 3 to 5, and in another embodiment, n may be 1, k3 may be 0, and k4 may be 3 or 4.

The X is bound to the terminal end of $Y_2$, for example when $Y_2$ is an alkylene group, the X may be bound to the terminal carbon.

The first monomer of Chemical Formula 1 may be a monomer represented by Chemical Formula 1-1.

Chemical Formula 1-1

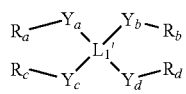

In Chemical Formula 1-1, $L_1'$ is selected from carbon; a substituted or unsubstituted C6 to C30 arylene group, for example a substituted or unsubstituted phenylene group; a substituted or unsubstituted C3 to C30 heteroarylene group; a substituted or unsubstituted C3 to C30 cycloalkylene group; and a substituted or unsubstituted C3 to C30 heterocycloalkylene group, $Y_a$ to $Y_d$ are independently a substituted or unsubstituted C1 to C30 alkylene group; a substituted or unsubstituted C2 to C30 alkenylene group; or a C1 to C30 alkylene group or a C2 to C30 alkenylene group wherein at least one methylene (—CH$_2$—) is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—) (wherein R is hydrogen or a C1 to C10 alkyl group), —NR— (wherein R is hydrogen or a C1 to C10 alkyl group), or a combination thereof, $R_a$ to $R_d$ may be $R^1$ of Chemical Formula 1 or —SH, and at least two of $R_a$ to $R_d$ may be —SH.

In an embodiment, $L_1'$ may be a substituted or unsubstituted phenylene group, and the substituted or unsubstituted C6 to C30 arylene group may be a substituted or unsubstituted phenylene group.

The first monomer of Chemical Formula 1 may include the compounds represented by Chemical Formulae 1-A to 1-D.

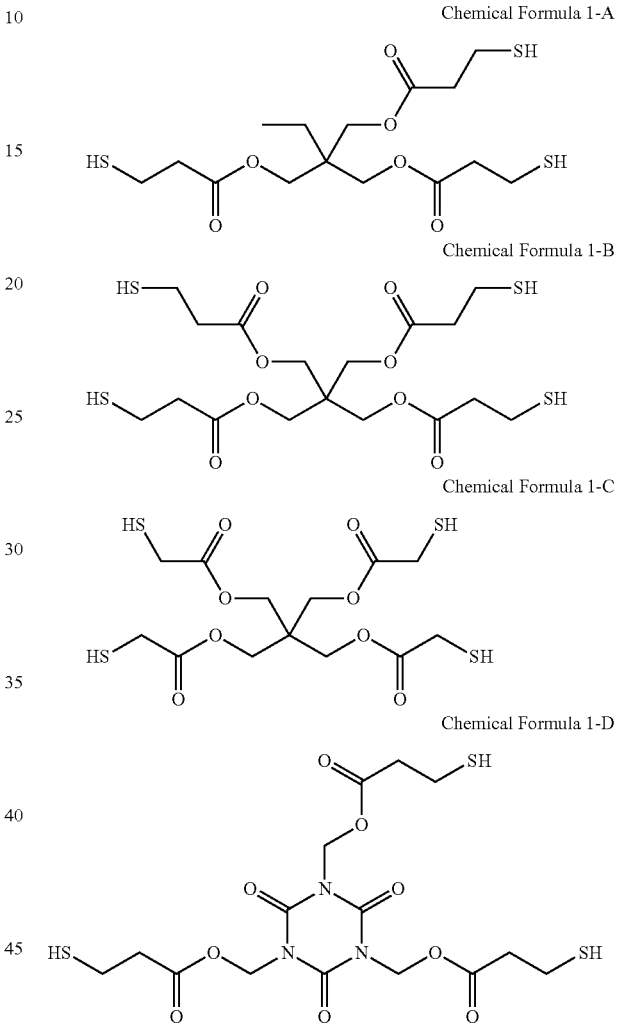

In Chemical Formula 2,

X is a C2 to C30 aliphatic organic group having a carbon-carbon double bond or a carbon-carbon triple bond, a C6 to C30 aromatic organic group having a carbon-carbon double bond or a carbon-carbon triple bond, or a C3 to C30 alicyclic organic group having a carbon-carbon double bond or a carbon-carbon triple bond.

The X may be selected from an acrylate group, a (meth)acrylate group, a substituted or unsubstituted C2 to C30 alkenyl group, a substituted or unsubstituted C2 to C30 alkynyl group, a substituted or unsubstituted C3 to C30 alicyclic organic group having a double bond or a triple bond, a substituted or unsubstituted C3 to C30 heterocyclic group having a double bond or a triple bond, a C3 to C30 alicyclic organic group substituted with a C2 to C30 alkenyl group, or a C2 to C30 alkynyl group and a C3 to C30 heterocycloalkyl group substituted with a C2 to C30 alkenyl group or a C2 to C30 alkynyl group.

In the definitions of X of Chemical Formula 2, the C2 to C30 alkenyl group may be selected from a vinyl group or an allyl group, and the substituted or unsubstituted C3 to C30 alicyclic organic group including a double bond or triple bond in a ring may be selected from a norbornene group, a maleimide group, a nadimide group, a tetrahydrophthalimide group, or a combination thereof.

In Chemical Formula 2, $L_2$ may be a substituted or unsubstituted pyrrolidine group, a substituted or unsubstituted tetrahydrofurane group, a substituted or unsubstituted pyridine group, a substituted or unsubstituted pyrimidine group, a substituted or unsubstituted piperidine group, a substituted or unsubstituted triazine group, a substituted or unsubstituted trioxotriazine group, or a substituted or unsubstituted isocyanurate group.

The second monomer of Chemical Formula 2 may include the compounds represented by Chemical Formulae 2-1 and 2-2.

Chemical Formula 2-1

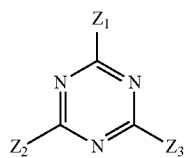

Chemical Formula 2-2

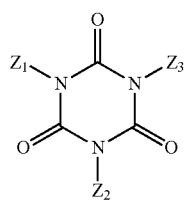

In Chemical Formulae 2-1 and 2-2, $Z_1$ to $Z_3$ are the same or different and correspond to *—$Y_2$—$(X)_n$ of Chemical Formula 2.

Examples of the second monomer of Chemical Formula 2 may include the compounds represented by Chemical Formulae 2-A to Chemical Formula 2-C.

Chemical Formula 2-A

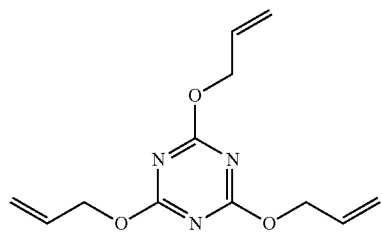

Chemical Formula 2-B

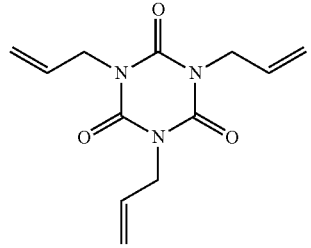

Chemical Formula 2-C

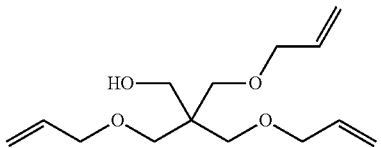

The amounts of the first monomer and second monomer are selected to ensure that the thiol group of the first monomer and the carbon-carbon unsaturated bond of the second monomer may be present at a mole ratio of about 0.5:1 to about 1:0.5, for example about 0.75:1 to about 1:0.75, or about 1:0.9 to about 1:1.1. When the first and second monomers are used such that the mole ratio of thiol group of the first monomer to the carbon-carbon unsaturated bond of the second monomer falls within the above ranges, a light emitting particle-polymer composite may have a high density network and excellent mechanical strength and properties.

The thiol-ene polymer of the light conversion layer 25 may be prepared by further polymerizing a third monomer having one thiol group at the terminal end, a fourth monomer having one carbon-carbon unsaturated bond at the terminal end, or a combination thereof, in addition to the first monomer and the second monomer.

The third monomer is a compound represented by Chemical Formula 1 where m and k2 are respectively 1, and the fourth monomer is a compound represented by Chemical Formula 2 where n and k4 are respectively 1.

The semiconductor nanocrystal may be dispersed in the matrix to improve compatibility between the matrix and the semiconductor nanocrystal. Among the materials for the matrix, the thiol-ene polymer has good compatibility with the semiconductor nanocrystal and may be cured at room temperature (about 20° C. to about 25° C.) in a short time, and thus, a high temperature process that may cause deterioration of the stability of a semiconductor nanocrystal, may be omitted. The thiol-ene polymer forms a dense cross-linking structure which blocks the semiconductor nanocrystals from outside substances such as oxygen or moisture and protects the semiconductor nanocrystals thereby increasing their stability. Thereby, luminous efficiency may be maintained for an increased period of time.

The light conversion layer 25 may further include an inorganic oxide particle. The inorganic oxide particle may be an inorganic oxide selected from silica, alumina, zinc oxide, titania, zirconia, and a combination thereof. The inorganic oxide particle may have a nanometer size or a micrometer size. The inorganic oxide particle may act as a light-scattering material.

The inorganic oxide particle may be included in an amount of about 1 weight percent (wt %) to about 20 wt %, for example about 1 wt % to about 15 wt %, for example about 2 wt % to about 15 wt %, based on the total amount of the light conversion layer 25. When the inorganic oxide particle is included within the ranges, light-scattering effects may be improved.

The light conversion layer 25 may be obtained by mixing a precursor (monomer) for a matrix, a semiconductor nanocrystal, a solvent, and optionally an inorganic oxide particle to provide a dispersion liquid, coating the dispersion liquid on the outer surface of the light-scattering structure 23, and then curing the same. The light conversion layer 25 may be formed in various thicknesses by using a mold, or by a casting method.

The light conversion layer 25 may include about 0.1 to about 20 wt %, for example about 0.2 to about 15 wt %, for another example about 0.3 to about 10 wt % of the semiconductor nanocrystal, based on the total weight of the light conversion layer 25. When using the semiconductor nanocrystal within the above ranges, a stable light conversion layer 25 may be formed.

The semiconductor nanocrystal may be coated with a polymer including a carboxyl group (—COOH) or a salt thereof capable of binding to a surface of the semiconductor nanocrystal and a metal cation capable of binding to the carboxylate anion group. The coating is applied to the surface of the semiconductor nanocrystal prior to dispersing the semiconductor nanocrystal in the matrix.

The polymer including a carboxyl group (—COOH) or a salt thereof may include an acrylic acid group, a methacrylic acid group, or a salt thereof. The polymer including a carboxyl group (—COOH) or a salt thereof may be selected from poly(alkylene-co-acrylic acid), poly(alkylene-co-methacrylic acid), a salt thereof, or a mixture thereof.

The polymer including a carboxyl group (—COOH) or a salt thereof may include about 1 mole percent (mol %) to about 100 mol %, for example about 2 mol % to about 50 mol %, or about 4 mol % to about 20 mol %, of a structural unit (monomer) including the carboxyl group or a salt thereof. When the structural unit including the carboxyl group or a salt thereof is included in the polymer within the above ranges, stability of the light conversion layer 25 may be improved.

The polymer having a carboxyl group (—COOH) or a salt thereof may have a melting point ("$T_m$") of about 50° C. to about 300° C., for example about 60° C. to about 200° C., or about 70° C. to about 200° C. When the polymer has a melting point within the above ranges, the semiconductor nanocrystal may be stably coated.

The semiconductor nanocrystal may be stabilized by coating it with a polymer having a carboxylate anion group. The coating of the carboxylate anion group on the surface of the semiconductor nanocrystal, provides an organic ligand on the surface and acts to passivate the semiconductor nanocrystal.

The polymer having a carboxylate anion group may include about 1 to about 100 mol %, for example about 1 to about 90 mol %, about 2 to about 50 mol %, or about 4 to about 20 mol % of the carboxylate anion group-containing structural unit. When the carboxylate anion group-containing structural unit is included within the above ranges in the polymer, the stability of the semiconductor nanocrystal may be improved.

The polymer having a carboxylate anion group may have a melting point ("$T_m$") of about 50° C. to about 400° C., specifically about 60° C. to about 350° C., or more specifically about 70° C. to about 300° C. When the melting point is within the above ranges, the polymer having a carboxylate anion group is stably coated on substantially the entire surface of the semiconductor nanocrystal or on a partial surface of the semiconductor nanocrystal.

The polymer having a carboxylate anion group is a polymer including a long aliphatic chain as a side chain and which includes the carboxylate anion group in the main chain or in a side chain of the long aliphatic chain. The polymer having a carboxylate anion group may be a polymer including an alkylene structural unit and a structural unit represented by Chemical Formula 3.

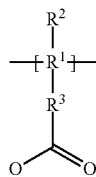

Chemical Formula 3

In Chemical Formula 3, $R^1$ is a substituted or unsubstituted C2 to C20 linear or branched alkylene group, specifically a substituted or unsubstituted C2 to C10 linear or branched alkylene group, $R^2$ is hydrogen or a methyl group, and $R^3$ is a single bond, a substituted or unsubstituted C1 to C50 alkylene group; a substituted or unsubstituted C2 to C50 alkenylene group; a C1 to C50 alkylene group wherein at least one methylene group (—CH$_2$—) is replaced by a sulfonyl group (—SO$_2$—), a carbonyl group (C(=O)), an ether group (—O—), a sulfide group (—S—), a sulfoxide group (—SO—), an ester group (—C(=O)O—), an amide group (—C(=O)NR—) (wherein R is hydrogen or a C1 to C10 alkyl group), or an imine group (—NR—) (wherein R is hydrogen or a C1 to C10 alkyl group); or a C2 to C50 alkenylene group wherein at least one methylene group (—CH$_2$—) is replaced by a sulfonyl group (—SO$_2$—), a carbonyl group (C(=O)), an ether group (—O—), a sulfide group (—S—), a sulfoxide group (—SO—), an ester group (—C(=O)O—), an amide group (—C(=O)NR—) (wherein R is hydrogen or a C1 to C10 alkyl group), or an imine group (—NR—) (wherein R is hydrogen or a C1 to C10 alkyl group).

The alkylene structural unit and the structural unit represented by Chemical Formula 3 may be copolymerized to provide a random copolymer or a block copolymer, but is not specifically limited thereto.

The polymer having a carboxylate anion group may be an ionized polymer of a poly(alkylene-co-(meth)acrylic acid), for example a poly(alkylene-co-acrylic acid) selected from poly(ethylene-co-acrylic acid), poly(propylene-co-acrylic acid), and poly(butylene-co-acrylic acid), poly(alkylene-co-methacrylic acid) selected from poly(ethylene-co-methacrylic acid), poly(propylene-co-methacrylic acid), and poly(butylene-co-methacrylic acid), or a combination thereof.

The amount of polymer having a carboxylate anion group coated on the surface of the semiconductor nanocrystal may be about 50 to about 10,000 parts by weight, for example about 50 to about 5,000 parts by weight, for example about 100 to about 1000 parts by weight, based on 100 parts by weight of the semiconductor nanocrystal. When the polymer having a carboxylate anion group is coated within the above ranges, the semiconductor nanocrystal may be sufficiently stabilized.

The metal cation may be bound to a carboxylate anion group that is not directly bound to the semiconductor nanocrystal in order to increase the melting point of the polymer having a carboxylate anion group and to improve the thermal stability. The bond between the metal cation and the carboxylate anion group may be a coordinate bond or an ionic bond. As a result of the bond between the metal cation and the carboxylate anion group, the polymer chains are more tightly adhered to one another to provide a polymer network. In addition, the polymer chains which are only weakly bonded to the semiconductor nanocrystal may be eliminated from the semiconductor nanocrystal.

The metal cation may be a cation of a metal selected from an alkaline-earth metal, a rare earth element, transition elements, a Group 12 element, a Group 13 element, or a combination thereof. The metal cation may be a cation of a metal selected from Mg, Ca, Sc, Ti, V, Cr, Mn, Fe, Co, Ni, Cu, Zn, Ga, Sr, Y, Zr, Nb, Mo, Cd, In, Ba, Au, Hg, Tl, or a combination thereof. In an embodiment, the metal cation may be a polyvalent metal cation.

The metal cation may be present in an amount of about 0.1 to about 1.5 mole, for example about 0.3 to about 1.5 mole, for example about 0.3 to about 1 mole, based on 1 mole of the carboxylate anion group of the polymer. Within the above ranges, the metal cation may be easily bound to the carboxylate anion group.

The semiconductor nanocrystal coated with the polymer having the carboxylate anion group may be prepared by reacting the semiconductor nanocrystal, a polymer having a carboxyl group (—COOH), and a metal compound including a metal cation capable of binding with the carboxyl group, and drying the reaction product.

In other words, the polymer having a carboxyl group (—COOH) is dispersed in an organic solvent to provide a polymer dispersion, the polymer dispersion is mixed with a semiconductor nanocrystal to provide a mixture, the mixture is combined with a metal compound including metal cations capable of bonding with the carboxyl group, and the resulting product is dried so as to provide the semiconductor nanocrystal coated with the polymer having the carboxylate anion group.

The polymer having a carboxyl group may be a polymer including a alkylene structural unit and a (meth)acrylic acid structural unit. These structural units may be copolymerized to provide a random copolymer or a block copolymer, but are not limited thereto. The polymer having a carboxyl group may be selected from poly(ethylene-co-acrylic acid), poly(ethylene-co-methacrylic acid), poly(propylene-co-acrylic acid), poly(propylene-co-methacrylic acid), poly(butylene-co-acrylic acid), poly(butylene-co-methacrylic acid), or a mixture thereof.

The metal compound may be an organometallic compound, an organic salt, or an inorganic salt including a metal selected from an alkaline-earth metal, a rare earth element, a transition element, a Group 12 element, a Group 13 element, or a combination thereof. The metal compound may be an organometallic compound, an organic salt, or an inorganic salt including a metal selected from Mg, Ca, Sc, Ti, V, Cr, Mn, Fe, Co, Ni, Cu, Zn, Ga, Rb, Sr, Y, Zr, Nb, Mo, Cd, In, Ba, Au, Hg, Tl, or a combination thereof. The organometallic compound may include dimethyl zinc, diethyl zinc, dimethyl cadmium, ferrocene, and the like, but is not limited thereto. The organic salt may include a compound including an anionic group such as an acetate group, a stearate group, an oleate group, an acetyl acetonate group, and the like, but is not limited thereto. The inorganic salt may include a halide (e.g., chloride), nitrate, sulfate, and the like, but is not limited thereto.

After light emitted from the LED 15 passes through the light conversion layer 25 including semiconductor nanocrystals, white light may be obtained. By changing the composition and size of the semiconductor nanocrystals in the light conversion layer 25, blue, green, and red light may be controlled to a desirable ratio so as to provide white light having excellent color reproducibility and color purity. Such white light may have color coordinates where Cx is about 0.24 to about 0.56, for example about 0.25 to about 0.35, and Cy is about 0.20 to 0.42, for example about 0.23 to about 0.35, in a CIE 1931 xy chromaticity diagram.

For example, when the LED 15 is a blue LED, the light conversion layer 25 includes a yellow semiconductor nanocrystal emitting yellow light or a mixture of a green semiconductor nanocrystal emitting green light and a red semiconductor nanocrystal emitting red light. The green semiconductor nanocrystal and the red light emitting semiconductor nanocrystal may be used to provide a ratio of optical density (OD) (absorbance at first maximum absorption wavelength in a UV-Vis absorption spectrum) of about 1.5:1 to about 4:1, and specifically about 2:1 to about 3:1.

The light emitting peak wavelength of the blue LED may be in a range of about 440 nm to about 455 nm, the light emitting peak wavelength of the yellow light emitting semiconductor nanocrystal may be in a range of about 546 nm to about 605 nm, the light emitting peak wavelength of the green light emitting semiconductor nanocrystal may be about 510 nm to about 545 nm, for example about 520 nm to about 545 nm, and the light emitting peak wavelength of the red light emitting semiconductor nanocrystal may be about 605 nm to about 650 nm, for example about 610 nm to about 640 nm.

The light conversion layer 25 may include a plurality of layers. In this case, the plurality of layers may be disposed so that energy of the light emitting wavelength decreases going toward the LED 15. For example, if the LED 15 is a blue LED, the light conversion layer 25 may include a first light conversion layer including a red semiconductor nanocrystal and a second light conversion layer including a green semiconductor nanocrystal that are sequentially stacked in a direction away from the LED 15.

A thickness of the light conversion layer 25 may be about 10 micrometers (μm) to about 300 micrometers, for example about 10 micrometers to about 250 micrometers, for example about 10 micrometers to about 200 micrometers.

The organic barrier layer 27 is disposed on the outer surface of the stack structure 24.

The organic barrier layer 27 may include a polymer which is a polymerization product of a first monomer including at least two thiol (—SH) groups at a terminal end and a second monomer including at least two carbon-carbon unsaturated bonds at a terminal end. The organic barrier layer 27 may have a multi-layer structure including a plurality of layers in which where each layer includes different polymers.

The first monomer including at least two thiol (—SH) groups at the terminal end and the second monomer including at least two carbon-carbon unsaturated bonds at the terminal end are the same as in the thiol-ene polymer included in the matrix of the light conversion layer 25.

The organic barrier layer 27 may have a thickness of about 5 micrometers to about 200 micrometers, for example about 5 micrometers to about 250 micrometers, for example about 5 micrometers to about 300 micrometers. When the organic barrier layer 27 has a thickness within the above ranges, sufficient oxygen or moisture blocking properties may be ensured.

The organic barrier layer 27 may have an oxygen transmission rate of greater than or equal to about $10^{-3}$ cubic centimeters per square meter per day ($cc/m^2/d$) and less than or equal to about $10^{-1}$ $cc/m^2/d$, and a moisture transmission rate of greater than or equal to about $10^{-3}$ $g/m^2/d$ and less than or equal to about $10^{-1}$ $g/m^2/d$. When the organic barrier layer 27 has the oxygen transmittance and moisture transmittance rates within the above ranges, the semiconductor nanocrystals of the light conversion layer 25 may be stably protected.

In an embodiment, by sequentially decreasing a refractive index of the light-scattering structure 23, the light conversion layer 25, and the organic barrier layer 27 as a distance between each layer and the LED 15 increases, the light path may be controlled so that light emitted from the LED 15 is concentrated within a predetermined range by the refractive index difference.

Figure 2:
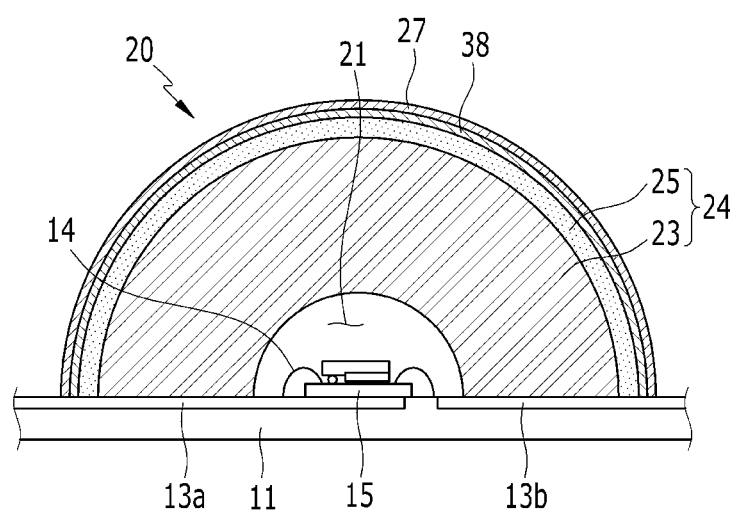

The LED package may further include an additional first inorganic barrier layer between the organic barrier layer 27 and the light conversion layer 25. FIG. 2 is a schematic view showing an LED package according to another embodiment including a multi-layered barrier layer including an organic barrier layer 27 and a first inorganic barrier layer 38.

As shown in FIG. 2, an LED package 20 includes the first inorganic barrier layer 38 between the organic barrier layer 27 and the light conversion layer 25.

The first inorganic barrier layer 38 may include a material selected from an inorganic oxide, an inorganic polymer, an organic/inorganic hybrid polymer, a polymer of a first monomer including at least two thiol (—SH) groups at a terminal end and a siloxane-based second monomer or oligomer having at least one carbon-carbon unsaturated bond at a terminal end, or a combination thereof. Such a first inorganic barrier layer 38 includes or consists of inorganic components, and thereby interface characteristics between the organic barrier layer 27 and the light conversion layer 25 may be improved.

The inorganic oxide may be selected from silica, alumina, zinc oxide, titania, zirconia, or a combination thereof.

The inorganic polymer may include a silicone resin including a —Si—O— bond or a resin including a —Si—N— bond.

The organic/inorganic hybrid polymer may include an organic functional group.

The organic/inorganic hybrid polymer may include a cross-linked structure of a first siloxane bond (—Si—O—Si—)-containing moiety, a second siloxane bond-containing moiety including at least one organic functional group, and a third siloxane bond-containing moiety including at least one reactive functional group.

The organic/inorganic hybrid polymer may further include a fourth —O-M-O— bond-containing moiety (wherein M is selected from Al, Sn, Ti, Zr, Ge, B, or a combination thereof).

The organic/inorganic hybrid polymer may be a condensation polymerization polymer of a first alkoxy silane of Chemical Formula 4, a second alkoxy silane of Chemical Formula 5, and a third alkoxysilane of Chemical Formula 6.

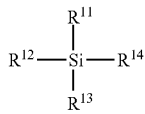

Chemical Formula 4

In Chemical Formula 4, $R^{11}$ to $R^{14}$ are independently a hydroxy group, a halogen, a substituted or unsubstituted C1 to C8 linear or branched alkoxy group, a substituted or unsubstituted C6 to C12 aryloxy group, a substituted or unsubstituted C2 to C10 alkylcarbonyl group, or a substituted or unsubstituted C2 to C10 alkoxycarbonyl group.

The first alkoxy silane of Chemical Formula 4 may be, for example, tetramethoxysilane, tetraethoxysilane, tetrabutoxysilane, and the like.

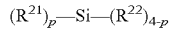 Chemical Formula 5

In Chemical Formula 5, $R^{21}$ is a substituted or unsubstituted C6 to C20 aryl group, a substituted or unsubstituted C1 to C20 linear or branched alkyl group, for example a fluoroalkyl group, a substituted or unsubstituted C1 to C20 aminoalkyl group, a substituted or unsubstituted C2 to C20 alkynyl group, a substituted or unsubstituted C2 to C20 alkenyl group, a substituted or unsubstituted C1 to C20 amine group, —C(=O)OR' (wherein R' is a C1 to C20 linear or branched alkyl group), or —C(=O)NRR' (wherein R and R' are independently a C1 to C20 linear or branched alkyl group), $R^{22}$ is a hydroxy group, a halogen, a substituted or unsubstituted C1 to C8 linear or branched alkoxy group, a substituted or unsubstituted C6 to C12 aryloxy group, a substituted or unsubstituted C2 to C10 alkylcarbonyl group, or a substituted or unsubstituted C2 to C10 alkoxycarbonyl group, and p is an integer ranging from 1 to 3.

The second alkoxy silane of Chemical Formula 5 may be, for example, methyltrimethoxysilane, ethyltrimethoxysilane, propyltrimethoxysilane, butyltrimethoxysilane, pentyltrimethoxysilane, hexyltrimethoxysilane, methyltriethoxysilane, ethyltriethoxysilane, propyltriethoxysilane, butyltriethoxysilane, pentyltriethoxysilane, hexyltriethoxysilane, dimethyldimethoxysilane, diethyldimethoxysilane, dipropyldimethoxysilane, dibutyldimethoxysilane, dipentyldimethoxysilane, dihexyldimethoxysilane, dimethyldiethoxysilane, diethyldiethoxysilane, dipropyldiethoxysilane, dibutyldiethoxysilane, dipentyldiethoxysilane, dihexyldiethoxysilane, aminomethyltrimethoxysilane, aminoethyltrimethoxysilane, aminopropyltrimethoxysilane, aminobutyltrimethoxysilane, aminopentyltrimethoxysilane, aminohexyltrimethoxysilane, aminomethyltriethoxysilane, aminoethyltriethoxysilane, aminopropyltriethoxysilane, aminobutyltriethoxysilane, aminopentyltriethoxysilane, aminohexyltriethoxysilane, pentyltrimethoxysilane, diphenyldimethoxysilane, phenyltriethoxysilane, diphenyldiethoxysilane, and the like, or a combination thereof.

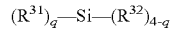 Chemical Formula 6

In Chemical Formula 6, $R^{31}$ is a photo-cross-linking or thermal cross-linking reactive functional group, for example a (meth)acryloxy group; an epoxy group, for example a glycidyloxy group; a spiro-orthoester group; a substituted or unsubstituted C2 to C30 alkenyl group; a substituted or unsubstituted C2 to C30 alkynyl group; a substituted or unsubstituted C3 to C30 alicyclic organic group having a double bond or a triple bond; a substituted or unsubstituted C3 to C30 heterocyclic group having a double bond or a triple bond; a C3 to C30 alicyclic organic group substituted with a C2 to C30 alkenyl group or a C2 to C30 alkynyl group; or a C3 to C30 heterocycloalkyl group substituted with a C2 to C30 alkenyl group or a C2 to C30 alkynyl group, $R^{32}$ is a hydroxy group, a halogen, a substituted or unsubstituted C1 to C8 linear or branched alkoxy group, a substituted or unsubstituted C6 to C12 aryloxy group, a substituted or unsubstituted C2 to C10 alkylcarbonyl group, or a substituted or unsubstituted C2 to C10 alkoxycarbonyl group, and q is an integer ranging from 1 to 3.

The organic/inorganic hybrid polymer may be a condensation polymerization product of the alkoxy silane compounds of Chemical Formula 4 to 6 and an alkoxide compound of Chemical Formula 7.

 Chemical Formula 7

In Chemical Formula 7, $R^{41}$ is a hydroxy group, a halogen, a substituted or unsubstituted C1 to C8 linear or branched alkoxy group, for example, a methoxy group, an ethoxy group, an isopropoxy group, or a t-butoxy group, a substituted or unsubstituted C6 to C12 aryloxy group, a substituted or unsubstituted C2 to C10 alkylcarbonyl group, or a substituted or unsubstituted C2 to C10 alkoxycarbonyl group, and M is selected from Al, Si, Sn, Ti, Zr, Ge, B, or a combination thereof, and r is determined according to a valance of M.

The first to third moieties of the condensation polymerization product may be derived from Chemical Formulas 4 to 6, respectively. The first alkoxy silane represented by Chemical Formula 4 undergoes condensation polymerization to provide a first moiety including a siloxane bond (—Si—O—Si—), the second alkoxy silane represented by Chemical Formula 5 undergoes condensation polymerization to provide a second moiety including a siloxane bond and at least one organic functional group, and the third alkoxy silane represented by Chemical Formula 6 undergoes condensation polymerization to provide a third moiety including a siloxane bond and a cross-linked structure of at least one reactive functional group. Therefore, the organic functional group of the second moiety may be $R^{21}$ of Chemical Formula 5, and the cross-linked organic functional group of the third moiety is provided by cross-linking of $R^{31}$ of Chemical Formula 6, a reactive functional group being capable of producing a photo-cross-linking bond, or a thermal cross-linking bond.

The second moiety may increase flexibility and the refractive index of the condensation polymerization polymer.

The first alkoxy silane, the second alkoxy silane, and the third alkoxy silane may be respectively used in an amount of about 0.5 wt % to about 55 wt %, about 35 wt % to about 99 wt %, and about 0.01 wt % to about 10 wt %, based on a total weight of the organic/inorganic hybrid polymer. For example, the first alkoxy silane may be used in an amount of about 50 wt % to about 55 wt %, based on a total weight of the organic/inorganic hybrid polymer. When the first alkoxy silane to the third alkoxy silane undergo condensation polymerization within the above ranges, a barrier layer having an improved refractive index, photo-stability, and thermal stability may be formed.

The siloxane-based second monomer or oligomer having at least two carbon-carbon unsaturated bonds at the terminal end of the first inorganic barrier layer 38 may be represented by Chemical Formula 8.

Chemical Formula 8

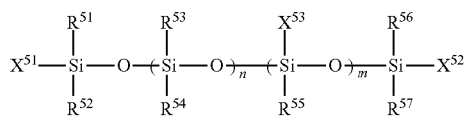

In Chemical Formula 8, $X^{51}$ to $X^{53}$ are each independently selected from hydrogen, a C1 to C30 aliphatic organic group having a carbon-carbon unsaturated bond, a C6 to C30 aromatic organic group having a carbon-carbon unsaturated bond-containing substituent, or a C3 to C30 alicyclic organic group having a carbon-carbon unsaturated bond, provided that not all of the $X^{51}$ to $X^{53}$ are hydrogen, $R^{51}$ to $R^{57}$ are each independently selected from hydrogen, a halogen, a substituted or unsubstituted C1 to C30 alkyl group, a substituted or unsubstituted C6 to C30 aryl group, a substituted or unsubstituted C6 to C30 heteroaryl group, a substituted or unsubstituted C3 to C30 cycloalkyl group, a substituted or unsubstituted C3 to C30 heterocycloalkyl group, a substituted or unsubstituted C2 to C30 alkenyl group, a substituted or unsubstituted C2 to C30 alkynyl group, a substituted or unsubstituted C3 to C30 alicyclic organic group having a double bond or a triple bond, a substituted or unsubstituted C3 to C30 heterocyclic group having a double bond or a triple bond, a C3 to C30 alicyclic organic group substituted with a C2 to C30 alkenyl group or a C2 to C30 alkynyl group, a C3 to C30 heterocycloalkyl group substituted with a C2 to C30 alkenyl group or a C2 to C30 alkynyl group, a hydroxy group, $NH_2$, a substituted or unsubstituted C1 to C30 amine group, an isocyanate group, an isocyanurate group, a (meth)acryloyloxy group, —ROR' (wherein R is a substituted or unsubstituted C1 to C20 alkylene group and R' is hydrogen or a C1 to C20 alkyl group), an acyl halide group (—RC(=O)X, wherein R is a substituted or unsubstituted alkylene group and X is a halogen), —C(=O)OR' (wherein R' is hydrogen or a C1 to C20 alkyl group), —CN, or —C(=O)NRR' (wherein R and R' are independently hydrogen or a C1 to C20 alkyl group), and n and m are independently an integer ranging from 0 to 300.

The siloxane-based second monomer or oligomer having at least two carbon-carbon unsaturated bonds may have a molecular weight of about 500 to about 100,000 Daltons (Da), for example about 1000 to about 10,000 Da. Herein, the molecular weight refers to a weight average molecular weight in case of a polymer. When the molecular weight is within the above ranges, reactivity between the siloxane-based second monomer or oligomer and the first monomer having at least two thiol (SH) groups at the terminal end may be easily controlled.

The first inorganic barrier layer 38 may have a thickness of about 10 nm to about 20 μm, for example about 10 nm to about 10 μm, for example about 10 nm to about 5 μm. When the thickness is in the above ranges, interface characteristics between the light conversion layer 25 and the organic barrier layer 27 may be improved.

The first inorganic barrier layer 38 may have an oxygen transmission rate of greater than or equal to about $10^{-3}$ $cc/m^2/d$ and less than or equal to about $10^{-1}$ $cc/m^2/d$ and a moisture transmission rate of greater than or equal to about $10^{-3}$ $g/m^2/d$ and less than or equal to about $10^{-1}$ $g/m^2/d$. When the first inorganic barrier layer 38 has the oxygen transmission rate and the moisture transmission rate within the above ranges, the semiconductor nanocrystal of light conversion layer 25 may be stably protected.

The first inorganic barrier layer 38 may include a plurality of different inorganic materials or may have a multi-layer structure including a plurality of layers in which each layer includes different inorganic materials.

Figure 3:
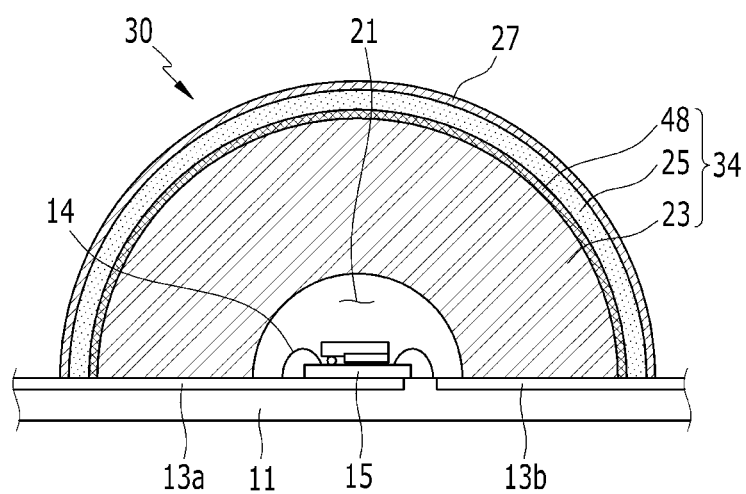

The LED package may further include a second inorganic barrier layer between the light-scattering structure and the light conversion layer. FIG. 3 is a schematic view showing the structure. Referring to FIG. 3, an LED package 30 includes an LED 15, a first lead electrode 13a, and a second lead electrode 13b on a substrate 11, wherein the LED 15 and each of the first lead electrode 13a and the second lead electrode 13b are electrically connected to each other through a wire 14. A second inorganic barrier layer 48 exists between the light-scattering structure 23 and the light conversion layer 25 to provide a stack structure 34.

The second inorganic barrier layer 48 may include a material selected from an inorganic oxide, an inorganic polymer, an organic/inorganic hybrid polymer, a polymerization product of a first monomer including at least two thiol (—SH) groups at the terminal end and a siloxane-based second monomer or oligomer having at least one carbon-carbon unsaturated bond at the terminal end, or a combination thereof. The inorganic oxide, the inorganic polymer, the organic/inorganic hybrid polymer and the polymer of a first monomer having at least two thiol (SH) groups at the terminal end and a siloxane-based second monomer or oligomer having at least two carbon-carbon unsaturated bonds at the terminal end may be the same as described for the first inorganic barrier layer 38.

The second inorganic barrier layer 48 may include a plurality of different inorganic materials or may have a multi-layer structure including a plurality of layers each of which includes different inorganic materials.

Figure 4:
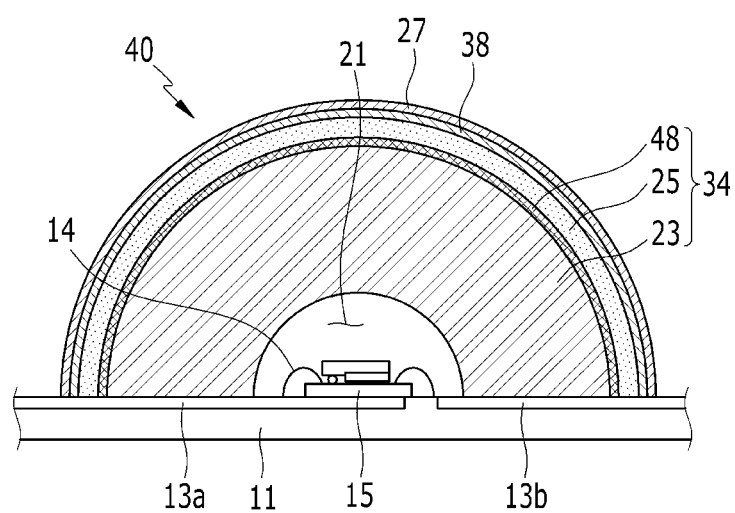

Referring to FIG. 4, an LED package 40 includes an organic barrier layer 27 disposed on the entire outer surface, a first inorganic barrier layer 38 disposed between the organic barrier layer 27 and the light conversion layer 25, and a second inorganic barrier layer 48 disposed between the light-scattering structure 23 and the light conversion layer 25. The light-scattering structure 23, the second inorganic barrier layer 48, and the light conversion layer 25 provide a stack structure 34.

Figure 5:
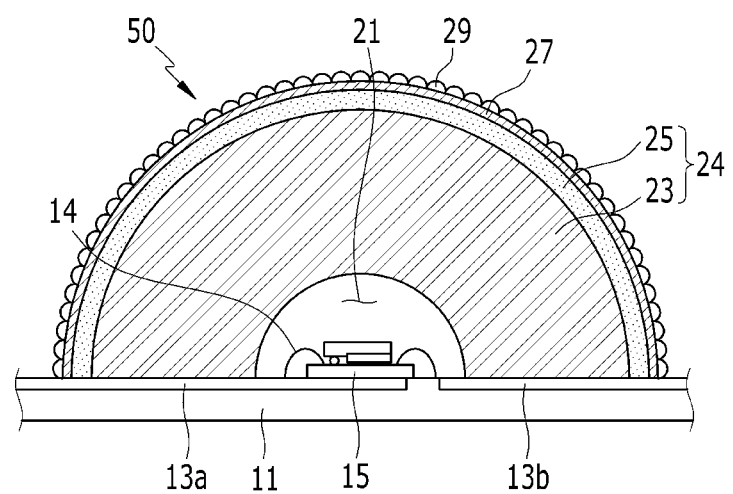

A metal pattern may be formed on the outer surface of the organic barrier layer 27 of the LED package 10 in FIG. 1. FIG. 5 is a schematic view showing the LED package 50 of FIG. 1 having such a structure, according to another embodiment. Referring to FIG. 5, the LED package 50 includes a metal pattern 29 on the outer surface of the organic barrier layer 27.

The metal pattern 29 may include a metal selected from aluminum (Al), nickel (Ni), silver (Ag), gold (Au), titanium (Ti), iron (Fe), copper (Cu), platinum (Pt), palladium (Pd), tungsten (W), or a combination thereof.

The shape of the metal pattern 29 is not particularly limited, but may be hemispherical and have photoreflective characteristics. The metal pattern 29 may reflect light emitted from the LED 15 and/or light emitted from the light conversion layer 25, and may amplify the light diffusion. In addition, the metal pattern 29 may radiate heat emitted from the LED 15.

The metal pattern 29 may be formed by a method such as screen printing, spray coating, deposition, and the like.

Figure 6:
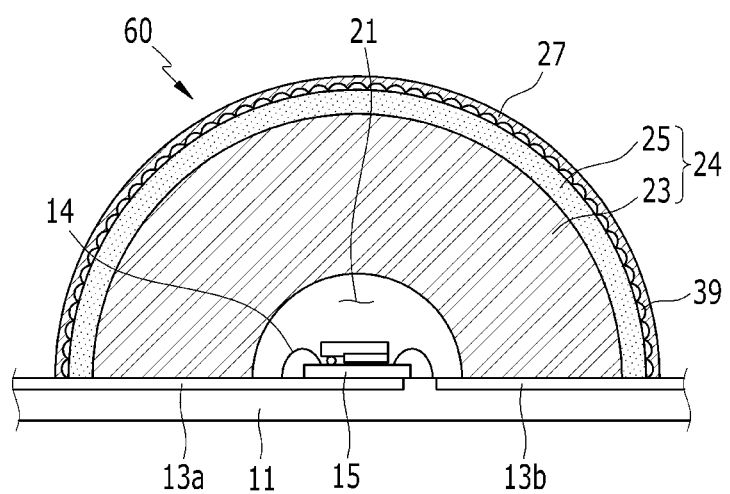

Alternatively, the metal pattern may be formed on the outer surface of the light conversion layer 25, as shown in FIG. 6. FIG. 6 is a schematic view showing an LED package 60 having the structure. Referring to FIG. 6, the LED package 60 includes a metal pattern 39 formed on the outer surface of light conversion layer 25. The metal pattern 39 is the same as described for the metal pattern 29 of FIG. 5.

Figure 7:
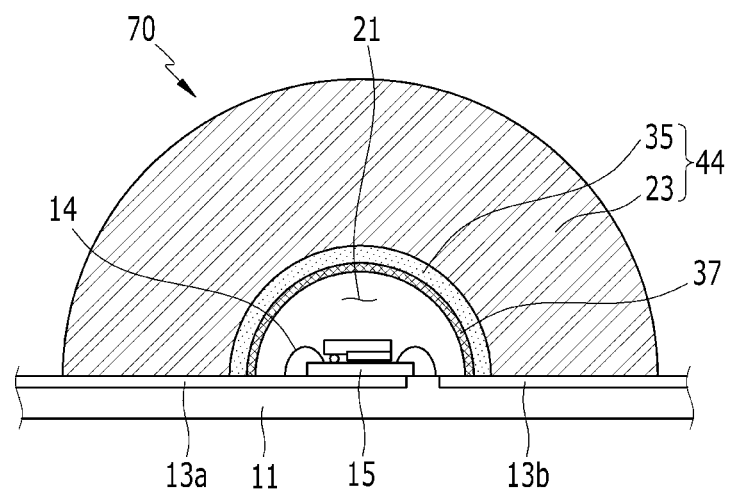

In another embodiment, a light conversion layer 35 may be disposed on the inner surface of light-scattering structure 23. FIG. 7 is a schematic view showing an LED package 70 having the structure. Referring to FIG. 7, the LED package 70 includes a light conversion layer 35 and an organic barrier layer 37 formed on the inner surface of a stack structure 44. The light conversion layer 35 is the same as described for the light conversion layer 25 of FIG. 1, and the organic barrier layer 37 is the same as described for the organic barrier layer 27 of FIG. 1. In this configuration, semiconductor nanocrystal of the light conversion layer 35 may be stably protected by the organic barrier layer 37.

In FIG. 7, the light-scattering structure 23 may be spaced apart from the LED by a predetermined distance. For example the light-scattering structure 23 may be a distance of less than or equal to about 5 mm, for example about 0.01 mm to about 3 mm, or for example, about 0.05 mm to about 1 mm, from the LED 15.

Although not shown, a metal pattern may be formed on at least one outer surface of the organic barrier layer 37 and the light conversion layer 35, of the LED package shown in FIG. 7. The outer surface refers to a surface positioned closest to the light-scattering structure 23. In addition, although not shown in the drawing, a metal pattern may be formed on the outer surface of the light-scattering structure 23. The metal pattern is the same as described for the metal pattern 29 of FIG. 5.

Figure 8:
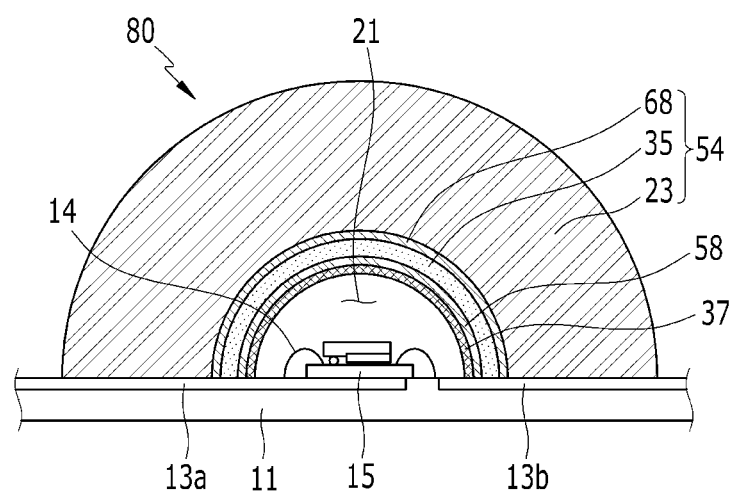

As shown in FIG. 8, an LED package 80 may further include a first inorganic barrier layer 58 disposed between the organic barrier layer 37 and the light conversion layer 35, and may further include a second inorganic barrier layer 68 between the light-scattering structure 23 and the light conversion layer 35. The light-scattering structure 23, the second inorganic barrier layer 68, and the light conversion layer 35 provide a stack structure 54. In FIG. 8, either of the first inorganic barrier layer 58 and the second inorganic barrier layer 68 may be omitted.

Figure 9:
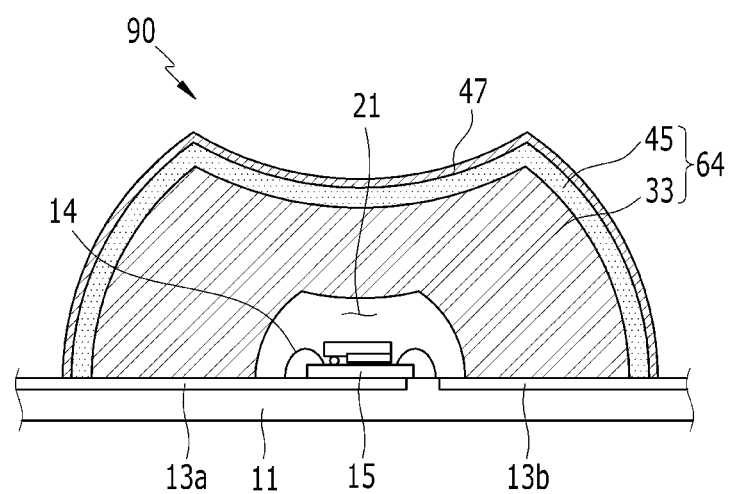

The light-scattering structure may have a concave lens-type structure as illustrated in FIG. 9. FIG. 9 is a schematic view showing an LED package 90 according to another embodiment. Referring to FIG. 9, the LED package 90 includes a light-scattering structure 33 and a light conversion layer 45, and includes an organic barrier layer 47 disposed on the outer surface of light conversion layer 45.

Since the light-scattering structure 33 widely diffuses light emitted from the LED 15, it may widen a beam angle of the backlight unit or the illumination device including the same. In addition, as the number of LEDs for providing a uniform surface light source is reduced, the volume of the backlight unit or the illumination device may be reduced.

The light-scattering structure 33 has the same structure as described for the light-scattering structure 23 of FIG. 1, except for having a concave lens-type shape. Similarly, the light conversion layer 45 and organic barrier layer 47 have the same structure as the light conversion layer 25 and the organic barrier layer 27 of FIG. 1, except for having different shapes which vary depending upon the shape of the light-scattering structure 33.

The LED package 90 may further include a first inorganic barrier layer (not shown) between the organic barrier layer 47 and the light-scattering structure 33, wherein the first inorganic barrier layer is the same as described for the first inorganic barrier layer 38 of FIG. 2.

In addition, LED package 90 may further include a second inorganic barrier layer (not shown) between the light-scattering structure 33 and the light conversion layer 45, and the second inorganic barrier layer is the same as described for the second inorganic barrier layer 48 of FIG. 3. Herein, the light-scattering structure 33 and the light conversion layer 45 provide a stack structure 64.

The LED package 90 may include both the first inorganic barrier layer and the second inorganic barrier layer.

Although not shown in FIG. 9, a metal pattern may be formed on the outer surface of the organic barrier layer 47, which is the same as described for the metal pattern 29 of FIG. 5. The metal pattern may be formed on the outer surface of the light conversion layer 45 as described in the metal pattern 39 of FIG. 6.

The light conversion layer and the organic barrier layer may be formed on the inner surface of the light-scattering structure 33. Except for the light-scattering structure 33 having the concave lens shape, the light-scattering structure 33 may be applied with the structures shown in FIGS. 7 and 8.

Figure 10:
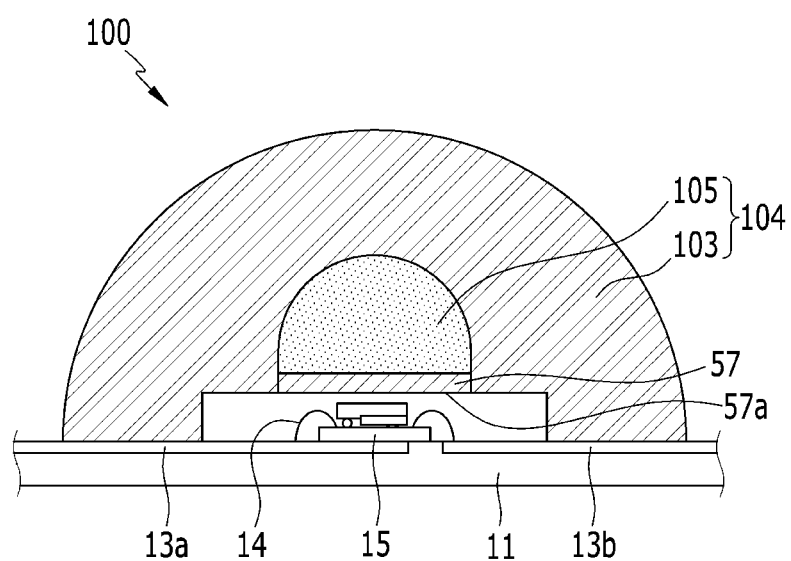

The light conversion layer may fill the space between the inside of the light-scattering structure and the LED. Referring to FIG. 10, the LED package 100 includes an LED 15, a first lead electrode 13a, and a second lead electrode 13b on a substrate 11, wherein the LED 15 is electrically connected to each of the first lead electrode 13a and second lead electrode 13b via a wire 14. The LED 15 and the stack structure 104 are spaced apart from each other, the stack structure 104 includes a light-scattering structure 103 and a light conversion material 105 is filled in a space under the light-scattering structure 103, and an organic barrier layer 57 is disposed on the lower surface of the light conversion material 105. The organic barrier layer 57 may be disposed on the inner surface of the light-scattering structure 103, and the light conversion layer 105 may be disposed between the light-scattering structure 103 and the organic barrier layer 57 and may fill a space inside of the light-scattering structure 103.

The light-scattering structure 103 has the same structure as the light-scattering structure 23 of FIG. 1 except for the shape thereof.

The light conversion material 105 may include the semiconductor nanocrystal for the light conversion layer 25 of FIG. 1.

The organic barrier layer 57 may include the material for the organic barrier layer 27 of FIG. 1.

Although not shown, a metal pattern may be provided on at least one of the outer surface of the light-scattering structure 103, the interface between the light conversion material 105 and the light-scattering structure 103, and the lower surface 57a of the organic barrier layer 57, in the LED package 100 shown in FIG. 10. The metal pattern may be the same as described for the metal pattern 29 of FIG. 5.

Figure 11:
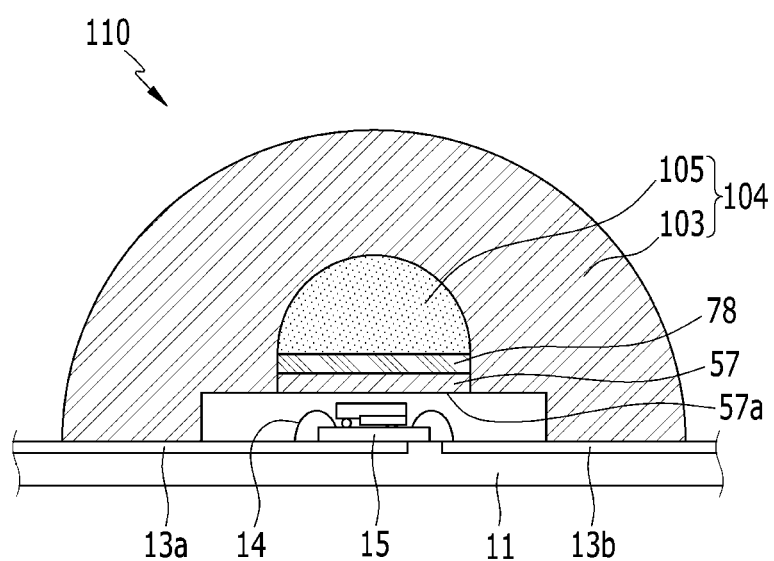

As shown in FIG. 11, the LED package 110 may further include a first inorganic barrier layer 78 between the light conversion material 105 and the organic barrier layer 57. The first inorganic barrier layer 78 may include a same material as described for the first inorganic barrier layer 38 shown in FIG. 2.

Although not shown, a metal pattern may be provided on at least one of the outer surface of light-scattering structure 103, the interface between the light conversion material 105 and the light-scattering structure 103, and a lower surface 57a of organic barrier layer 57, in the LED package 110 shown in FIG. 11. The metal pattern may be the same as described for the metal pattern 29 of FIG. 5.

A glass plate may be further disposed under the organic barrier layer 57, in LED packages 100 and 110 respectively shown in FIGS. 10 and 11.

Figure 12:
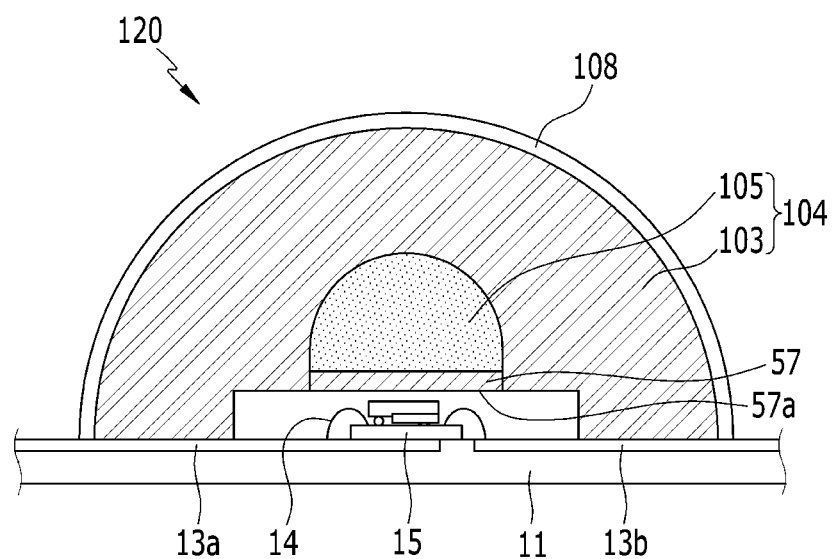

As shown in FIG. 12, the LED package 120 may further include an organic or inorganic barrier layer 108 on the outer surface of the light-scattering structure 103. The organic or inorganic barrier layer 108 may include a material as described for the organic barrier layer 27 of FIG. 1 or a material as described for the first inorganic barrier layer 38 shown in FIG. 2.

Although not shown, a metal pattern may be provided on at least one of the outer surface of the light-scattering structure 103, the interface between the light conversion material 105 and the light-scattering structure 103, the lower surface 57a of the organic barrier layer 57, and the organic or inorganic barrier layer 108, in the LED package 120 shown in FIG. 12. The metal pattern may be the same as described for the metal pattern 29 of FIG. 5.

An LED package according to another embodiment includes:
an LED;
a stack structure including
a light-scattering structure spaced apart from the LED, and
a light conversion layer disposed on an inner surface of the light-scattering structure and filling a space inside of the light-scattering structure, and which is configured to convert light emitted from the LED into white light, wherein the light conversion layer includes a semiconductor nanocrystal;
a first inorganic barrier layer under the light conversion layer; and
a glass plate under the first inorganic barrier layer.

Figure 13:
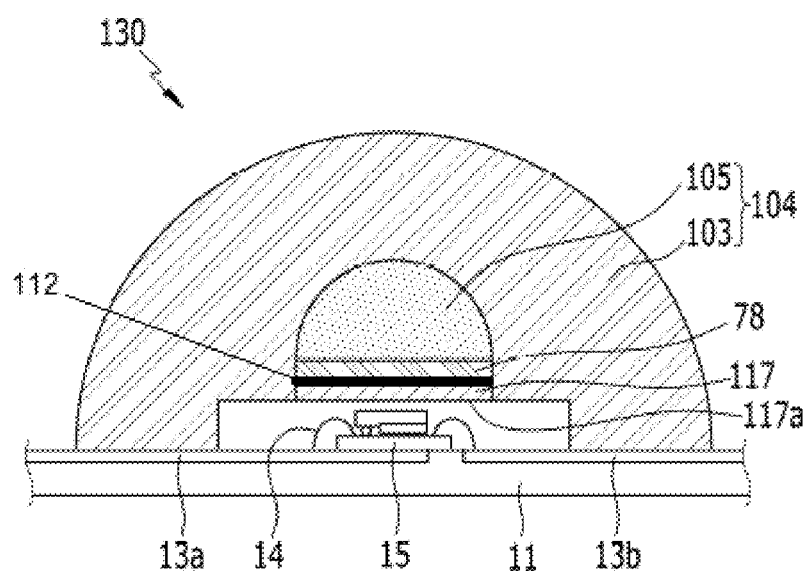

The LED package according to the embodiment is described referring to FIG. 13.

As shown in FIG. 13, the LED package 130 may include a glass plate 117 disposed under the first inorganic barrier layer 78. An adhesive layer 112 may be provided between the first inorganic barrier layer 78 and the glass plate 117. The adhesive layer 112 may include a curable resin, for example, at least one of a thiol resin, a thiol-ene resin, an epoxy resin, a phenol resin, a silanol resin, an amine resin, a unsaturated polyester resin, a polyimide resin, a silicone resin, an acrylic resin, a methacrylic resin, a vinyl resin, an olefin resin, an amide resin, a urethane resin, and an urea resin. In addition, the adhesive layer 112 may include a pressure sensitive adhesive (PSA). The adhesive layer may be a single layer or a plurality of layers.

Although not shown, a metal pattern may be provided on at least one of the outer surface of the light-scattering structure 103, the interface between the light conversion material 105 and the light-scattering structure 103, and a lower surface 117a of the glass plate 117, in the LED package 130 shown in FIG. 13. The metal pattern may be the same as described for the metal pattern 29 of FIG. 5.

Figure 14:
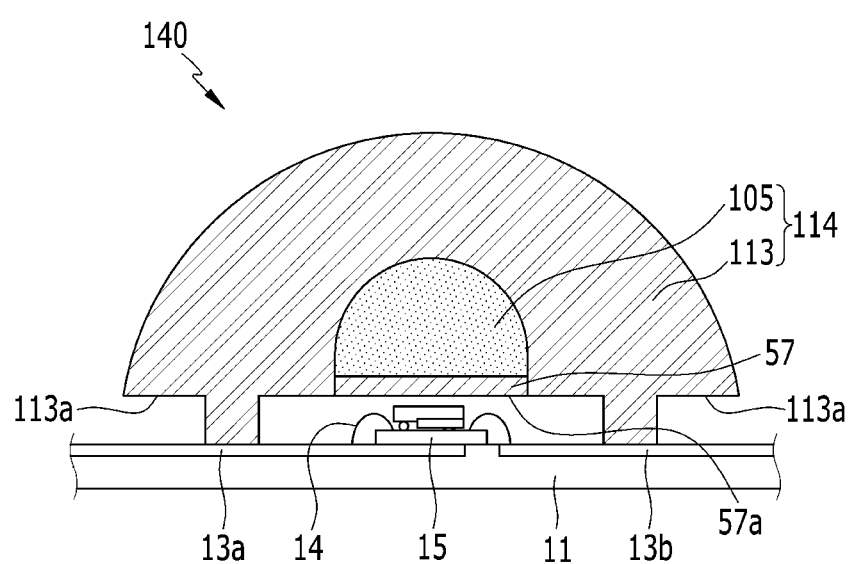

As shown in FIG. 14, the light-scattering structure 113 of the LED package 140 is spaced apart from the substrate at a predetermined distance, except for a minimum contact area to be sealed. Referring to FIG. 14, the LED package 140 includes an LED 15, a first lead electrode 13a, and a second lead electrode 13b on a substrate 11, wherein the LED 15 is electrically connected to each of the first lead electrode 13a and second lead electrode 13b via a wire 14. The LED 15 and a stack structure 114 are spaced apart from each other, the stack structure 114 includes a light-scattering structure 113 and a light conversion material 105 filled in a space under the light-scattering structure 113, and an organic barrier layer 57 is disposed on the lower surface of the light conversion material 105. A surface 113a where the light-scattering structure 113 does not contact the substrate 11, may be formed to be concavo-convex. The concavo-convex shape may be obtained when forming the light-scattering structure 113. Alternatively, the surface of the obtained light-scattering structure 113 may be textured to provide a concavo-convex shape. The texturing may be performed by mechanical polishing or chemical etching. The light-scattering structure 113 with the concavo-convex shape may play a role in diffusing light emitted therefrom.

Although not shown, a metal pattern may be provided on at least one of the outer surface of the light-scattering structure 113, the interface between the light conversion material 105 and the light-scattering structure 113, and the lower surface 57a of the organic barrier layer 57, in the LED package 140 shown in FIG. 14. The metal pattern may be the same as described for the metal pattern 29 of FIG. 5.

LED packages 10, 20, 30, 40, 50, 60, 70, 80, 90, 100, 110, 120, 130, and 140 shown respectively in FIGS. 1 to 14 may uniformly disperse light emitted from the LED 15, to provide a backlight unit and an illumination device having a wide beam angle of greater than or equal to about 120°, for example, greater than or equal to about 130°, or for example, greater than or equal to about 150°.

The backlight unit may further include a diffusion plate on the upper part of the LED packages 10, 20, 30, 40, 50, 60, 70, 80, 90, 100, 110, 120, 130, and 140.

The backlight unit may be applicable for a liquid crystal display device, for example, a direct-type liquid crystal display device.

Figure 15:
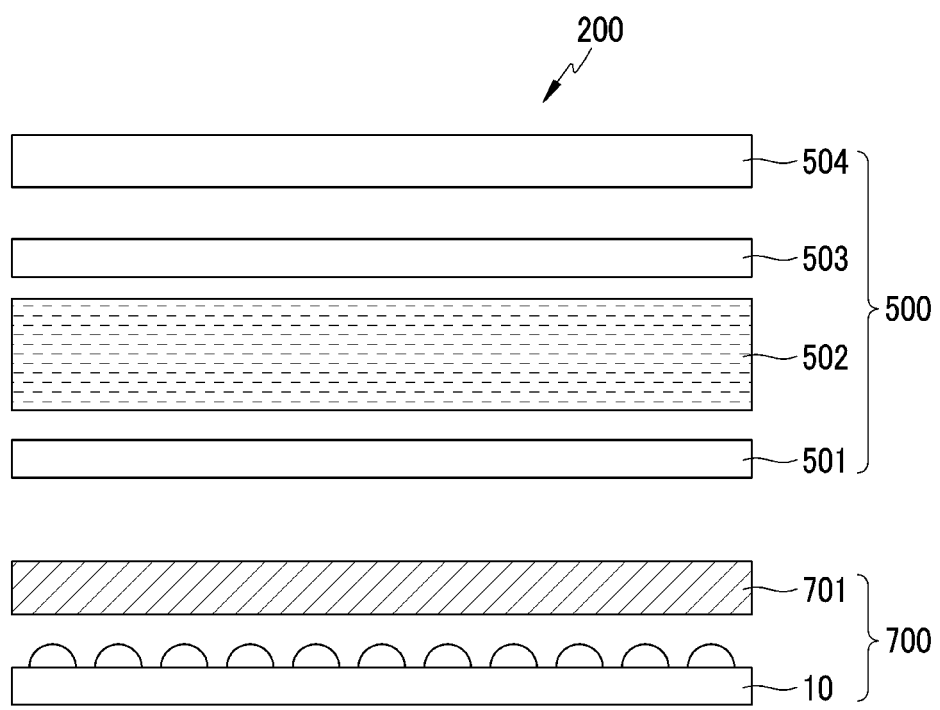
FIG. 15 is a schematic view of a liquid crystal display device according to an embodiment.
Figure 16:
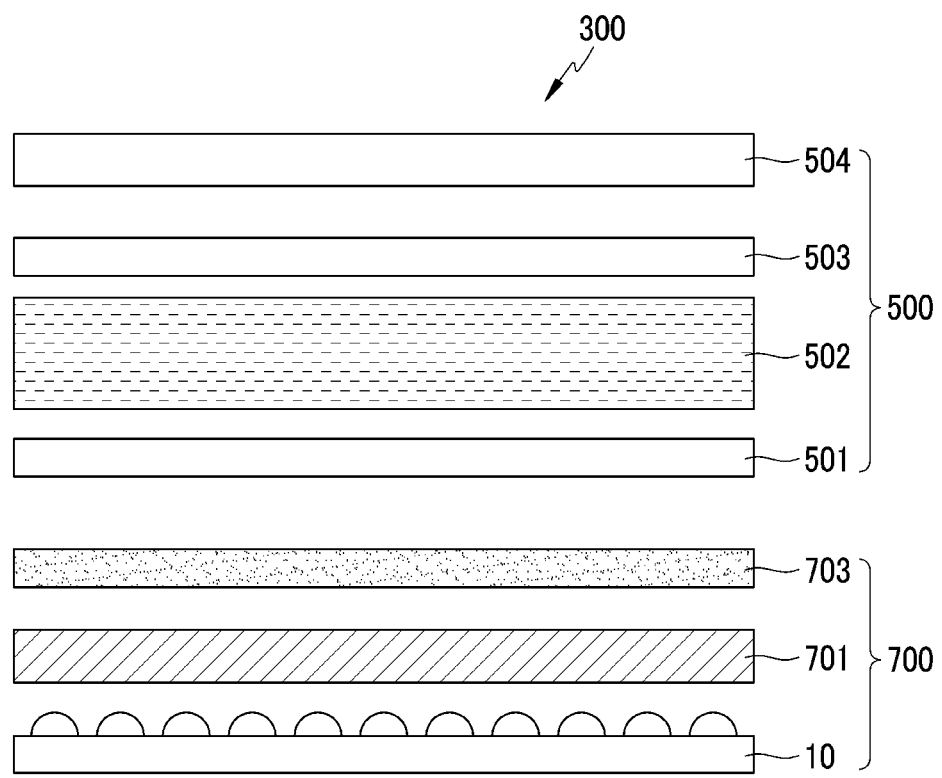
FIG. 16 is a schematic view of a liquid crystal display device according to another embodiment.

Hereinafter, a liquid crystal display device including the backlight unit will be described with reference to FIGS. 15 and 16. FIG. 15 is a schematic view showing a liquid crystal display device 200 according to one embodiment, and FIG. 16 is a schematic view showing a liquid crystal display device 300 according to another embodiment.

Referring to FIG. 15, the liquid crystal display device 200 includes a backlight unit 700 and a liquid crystal panel 500, configured to express an image in a predetermined color using white light emitted from the backlight unit 700.

The LED package 10 converts light emitted from the LED 15 into white light and emits the same toward the liquid crystal panel 500. Although FIG. 15 shows only the LED package 10, the other described LED packages 20, 30, 40, 50, 60, 70, 80, 90, 100, 110, 120, 130, and 140 may also be applied in the same manner.

A reflector (not shown) may be further disposed on the lower surface of the substrate 11 of the LED packages 10, 20, 30, 40, 50, 60, 70, 80, 90, 100, 110, 120, 130, and 140.

The backlight unit 700 includes a diffusion plate 701 that diffuses white light emitted from the LED packages 10, 20, 30, 40, 50, 60, 70, 80, 90, 100, 110, 120, 130, and 140. The diffusion plate 701 diffuses light emitted from the LED package towards the liquid crystal panel 500. A reflector (not shown) may be further disposed on the lower surface of the diffusion plate 701. The diffusion plate 701 improves uniformity of light emitted from the LED package. The light emitted from the LED package may be widely diffused by the stack structure and thus the diffusion plate 701 may be omitted.

The white light emitted from the backlight unit 700 is incident toward the liquid crystal panel 500. The liquid crystal panel 500 realizes a predetermined color image using the white light incident from the backlight unit 700. The liquid crystal panel 500 may have a structure in which a first polarizer 501, a liquid crystal layer 502, a second polarizer 503, and a color filter 504 are sequentially disposed. The white light emitted from the backlight unit 700 is transmitted through the first polarizer 501, the liquid crystal layer 502, and the second polarizer 503 and then into the color filter 504 to express a predetermined color image.

As shown in FIG. 16, at least one auxiliary film 703 selected from a prism sheet, a microlens sheet, or a luminance improvement film (e.g., a double brightness enhance film (DBEF)) may be further disposed on the LED package 10 and/or on the diffusion plate 701.

Hereinafter, the embodiments are illustrated in more detail with reference to examples. These examples, however, are not in any sense to be interpreted as limiting the scope of the disclosure.

EXAMPLES

Example 1: Manufacture of LED Package

InZnP/ZnSeS/ZnS green semiconductor nanocrystals with a light emitting wavelength of 531 nm are dispersed into 421.8 milliliter (mL) of toluene to have an optical density (OD) (absorbance at a first absorption maximum wavelength in the UV-Vis absorption spectrum of a 100-fold diluted solution) of 0.069, to prepare a green semiconductor nanocrystal dispersion liquid.

InP/ZnSeS/ZnS red semiconductor nanocrystals having a light emitting wavelength of 619 nm, are dispersed into 111.4 mL of toluene to have an optical density (OD) (absorbance at a first absorption maximum wavelength in the UV-Vis absorption spectrum of a 100-fold diluted solution) of 0.028, to prepare a red semiconductor nanocrystal dispersion liquid.

The green semiconductor nanocrystal dispersion liquid and the red semiconductor nanocrystal dispersion liquid are mixed, and the resultant is mixed with 100 mL of ethanol followed by centrifugation. The supernatant of the solution excluding the centrifuged precipitant is discarded, and the precipitant is added to a chloroform solvent to prepare a semiconductor nanocrystal solution including about 1 wt % semiconductor nanocrystals.

The silicone resins EG6301 A and EG6301 B available from Dow Corning are preliminarily mixed at a volume ratio of about 1:1 and vapor in the silicone resins is removed. About 100 microliter (μl) of the semiconductor nanocrystal solution and about 0.5 g of the mixture of silicone resins are mixed and uniformly stirred and maintained for about 1 hour (h) under vacuum in order to remove a chloroform solvent, to prepare a light conversion layer composition.

A pentaerythritol tetrakis(3-mercaptopropionate) monomer and a 1,3,5-triallyl-1,3,5-triazine-2,4,6-trione monomer are mixed at a 1:1 mole ratio, and then a photoinitiator, 1 wt % of oxy-phenyl-acetic acid 2-[2-oxo-2-phenyl-acetoxy-ethoxy]-ethyl ester, is mixed therewith to prepare an organic barrier layer composition.

A convex lens-shaped light-scattering structure may be disposed on a blue LED having a light emitting wavelength of 450 nm. The convex lens-shaped light-scattering structure is made of polymethyl(meth)acrylate and has an exterior diameter of 14 mm. A mold is produced to have a shape that is larger than the convex lens exterior diameter by 400 μm, and then the light conversion layer composition is coated on the mold and then the convex lens-shaped structure is inserted into the mold coated with the light conversion layer composition to provide a thickness of the light conversion layer composition of 200 μm between the mold and the convex lens-shaped structure. The structure is photo-cured by irradiating UV light at about 1000 millijoules per square centimeter (mJ/cm$^2$) to provide a light conversion layer, the mold is removed, and a silica (silicon dioxide) layer is formed thereon to provide a first inorganic barrier layer. After coating the organic barrier layer composition on the first inorganic barrier layer, it is photo-cured by irradiating UV light at about 2,000 mJ/cm$^2$ to provide an organic barrier layer and then attached on the blue LED to provide an LED package having a structure shown in FIG. 2.

Example 2: Manufacture of LED Package

An LED package having a structure shown in FIG. 3 is fabricated in accordance with the same procedure as in Example 1, except that a second inorganic barrier layer of a silica layer is additionally formed between the light-scattering structure and the light conversion layer according to Example 1.

Comparative Example 1: Manufacture of LED Package

A light conversion layer composition is fabricated in accordance with the same procedure as in Example 1. After coating the light conversion layer composition on the blue LED, it is photo-cured by irradiating UV light at about 1,000 mJ/cm$^2$ to provide a light conversion layer. A silica layer is formed on the light conversion layer to provide a first inorganic barrier layer. After coating the barrier layer composition on the first inorganic barrier layer, it is photo-cured by irradiating UV light at about 2,000 mJ/cm$^2$ to provide an organic barrier layer, so that an LED package is obtained.

Figure 17:
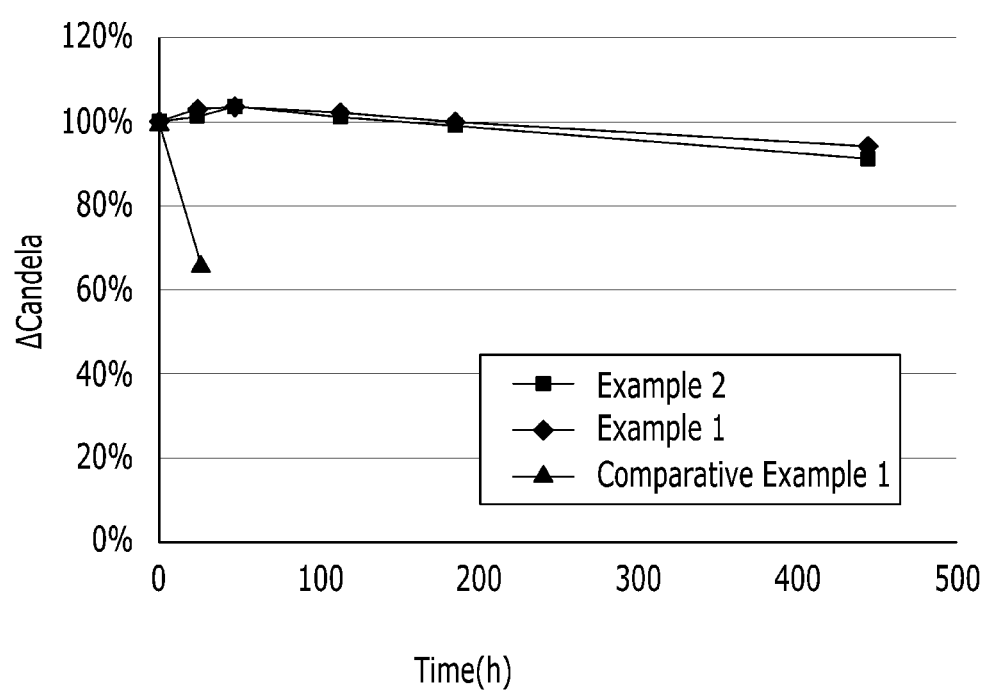
FIG. 17 is a graph of change in luminance (Δ luminance) versus time (hours, h) showing results of high temperature reliability tests conducted for a printed circuit board (PCB) mounted with an LED package from Example 1, Example 2, and Comparative Example 1.
Figure 18:
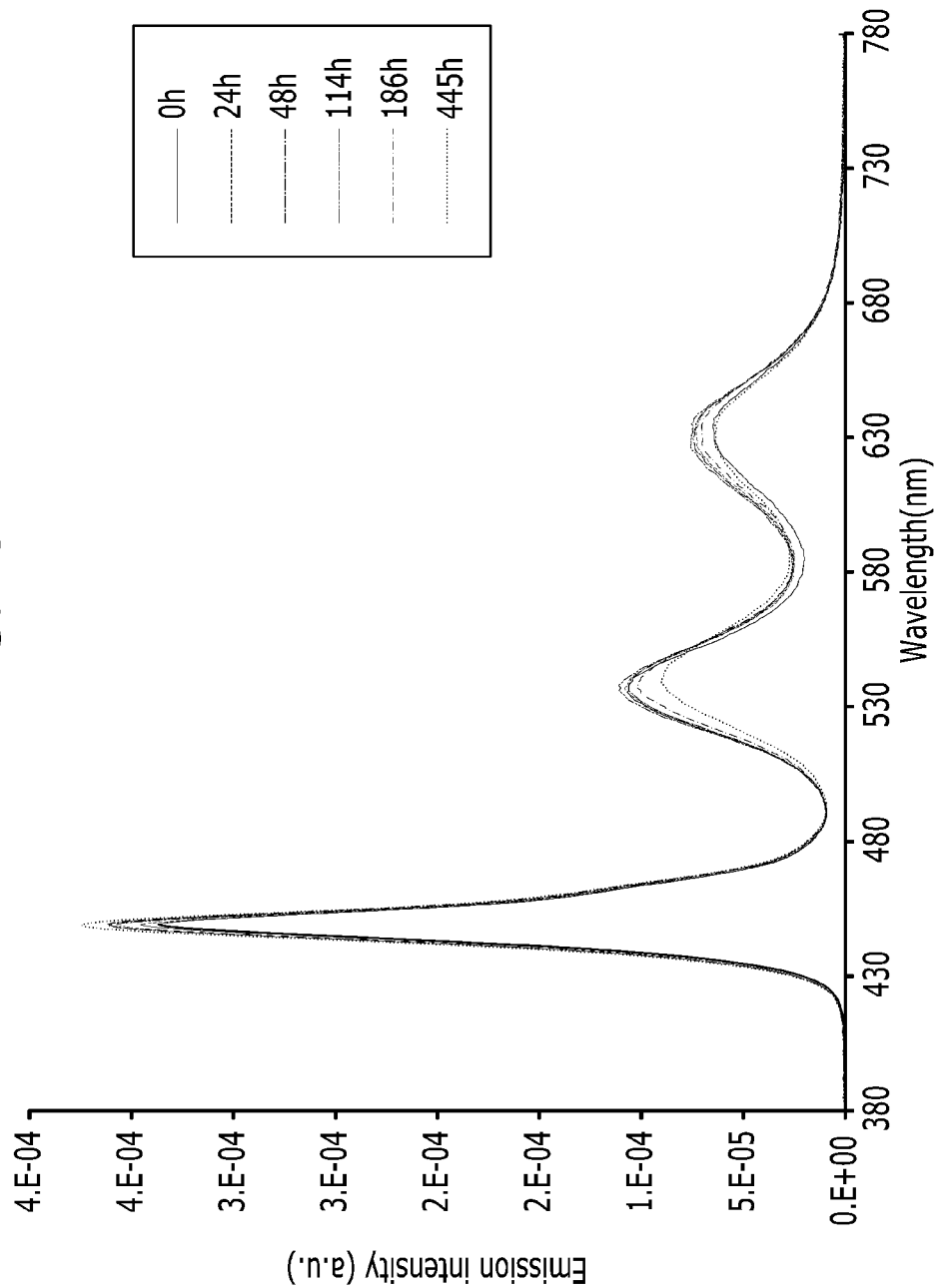
FIG. 18 is a graph of emission intensity (arbitrary units, a.u.) versus wavelength (nanometers, nm) showing a change in the spectrum over time for a printed circuit board (PCB) mounted with an LED package obtained from Example 1.

In order to evaluate the reliability of LED packages obtained from Example 1, Example 2, and Comparative Example 1, each LED package is mounted on a printed circuit board (PCB). The PCBs mounted with the LED packages according to Examples 1 and 2 are driven at 270 milliampere (mA) at a high temperature of 60° C., while the PCB mounted with the LED package according to Comparative Example 1 is driven at 200 mA, at which current conditions are mitigated, at a high temperature of 60° C., then the luminance of each LED package is measured, and the results are shown in FIG. 17. FIG. 17 is a view showing results of high temperature reliability tests of a printed circuit board (PCB) mounted with the LED packages obtained from Example 1, Example 2, and Comparative Example 1. FIG. 18 is a view showing a spectrum variation of the PCB mounted with LED package of Example 1, depending on time lapse. The measuring equipment is a reflective spectrophotometer, CS-2000, manufactured by KONICA MINOLTA.

The luminance variation ratio (Δ luminance) and the color coordinate variation ratio after driving the PCBs mounted with the LED packages according to Examples 1 and 2 for 445 h with respect to the initial values before the driving, and the luminance variation ratio and the color coordinate variation ratio after driving the PCB mounted with the LED package according to Comparative Example 1 for 24 h with respect to the initial values before the driving, are shown in the following Table 1.

TABLE 1

|  | Example 1 | Example 2 | Comparative Example 1 |
| --- | --- | --- | --- |
| Driving time | 445 h | 445 h | 24 h |
| ΔLuminance (cd/m$^2$) | 89.5% | 90.8% | 66.3% |
| ΔCx | −0.007 | −0.006 | −0.026 |
| ΔCy | −0.027 | −0.022 | −0.048 |

Referring to FIG. 17, FIG. 18, and Table 1, it is understood that the PCB mounted with the LED packages of Example 1 and Example 2 maintains luminance of greater than or equal to 89% after being driven at a high current at a high temperature for a long time, and has less aging change of color coordinates. Compared to this, it is confirmed that the luminance is significantly decreased after 24 h and the color coordinate aging change is substantial in the PCB mounted with the LED package of Comparative Example 1.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims. Therefore, the aforementioned embodiments should be understood to be exemplary but not limiting the present invention in any way.

What is claimed is:

1. A light emitting diode package comprising:
   a light emitting diode;
   a stack structure comprising,
      a light-scattering structure spaced apart from the light emitting diode, and
      a light conversion layer disposed on an outer surface of the light-scattering structure and configured to convert light emitted from the light emitting diode into white light, wherein the light conversion layer comprises a semiconductor nanocrystal;
   an unoccupied space between the light-emitting diode and the stack structure; and
   an organic barrier layer disposed on a surface of the light conversion layer,
   wherein the light-scattering structure is directly adjacent to the space and the light-scattering structure does not comprise a semiconductor nanocrystal,
   wherein refractive indexes of the light-scattering structure, the light conversion layer, and the organic barrier layer decrease sequentially as a distance between each layer increases from the light emitting diode, such that the refractive index of the light-scattering structure is greater than the refractive index of the light conversion layer, and the refractive index of the light conversion layer is greater than the refractive index of the barrier layer, and
   wherein the organic barrier layer has an oxygen transmission rate of greater than or equal to about 10$^{-3}$ cubic centimeters per square meter per day and less than or equal to about 10$^{-1}$ cubic centimeters per square meter per day.

2. The light emitting diode package of claim 1, wherein the light emitting diode is a blue light source or an ultraviolet light source.

3. The light emitting diode package of claim 1, wherein the light-scattering structure has a structure in a shape of a lens.

4. The light emitting diode package of claim 3, wherein the structure has a concave lens shape or a convex lens shape.

5. The light emitting diode package of claim 1, wherein the light-scattering structure consists of the polymer, and the polymer is selected from polymethyl(meth)acrylate, polycarbonate, polyvinyl alcohol, an epoxy-containing polymer, a silicone polymer, or a combination thereof.

6. The light emitting diode package of claim 1, wherein the light-scattering structure has transmittance of greater than or equal to about 80%.

7. The light emitting diode package of claim 1, wherein the light-scattering structure consists of a polymer having a glass transition temperature of greater than or equal to about 85° C.

8. The light emitting diode package of claim 1, wherein the light-scattering structure has a refractive index of greater than or equal to about 1.4.

9. The light emitting diode package of claim 1, wherein the light-scattering structure has a concavo-convex shape.

10. The light emitting diode package of claim 1, wherein the light-scattering structure is spaced apart from the LED by a distance of less than or equal to about 5 millimeters.

11. The light emitting diode package of claim 1, wherein the light conversion layer comprises the semiconductor nanocrystal and a matrix.

12. The light emitting diode package of claim 11, wherein the matrix comprises a material selected from a silicone resin, an epoxy resin, a thiol-ene polymer, a (meth)acrylate-polymer, silica, alumina, zinc oxide, zirconia, titania, and a combination thereof.

13. The light emitting diode package of claim 1, wherein the semiconductor nanocrystal has a full width at half maximum of less than or equal to about 45 nanometers in a photoluminance wavelength spectrum.

14. The light emitting diode package of claim 1, wherein the semiconductor nanocrystal is coated with a polymer comprising a carboxyl group or a salt thereof.

15. The light emitting diode package of claim 14, wherein the polymer including a carboxyl group or a salt thereof is selected from poly(alkylene-co-acrylic acid), poly(alkylene-co-methacrylic acid), a salt thereof, or a mixture thereof.

16. The light emitting diode package of claim 1, wherein the semiconductor nanocrystal is further coated with a polymer having a carboxylate anion group capable of binding to a surface of the semiconductor nanocrystal and a metal cation capable of binding the carboxylate anion group,
wherein a metal of the metal cation is different from a metal of the semiconductor nanocrystal.

17. The light emitting diode package of claim 1, wherein the light conversion layer comprises a yellow semiconductor nanocrystal or a mixture of a red semiconductor nanocrystal and a green semiconductor nanocrystal.

18. The light emitting diode package of claim 1, wherein the light conversion layer further comprises an inorganic oxide particle.

19. The light emitting diode package of claim 18, wherein the inorganic oxide particle is selected from silica, alumina, zinc oxide, zirconia, titania, and a combination thereof.

20. The light emitting diode package of claim 1, further comprising a transparent polymer filling a space inside of the light-scattering structure.

21. The light emitting diode package of claim 20, wherein the LED package further includes a first inorganic barrier layer between the light conversion layer and the organic barrier layer.

22. The light emitting diode package of claim 20, wherein the light emitting diode package further comprises an organic barrier layer or an inorganic barrier layer on the outer surface of the light-scattering structure.

23. The light emitting diode package of claim 20, wherein the light emitting diode package further comprises a glass plate under the organic barrier layer.

24. The light emitting diode package of claim 1, wherein the light emitting diode package further comprises a metal pattern on at least one of an outer surface of the organic barrier layer and the outer surface of the light conversion layer.

25. The light emitting diode package of claim 24, wherein the metal pattern comprises a metal selected from aluminum, nickel, silver, gold, titanium, iron, copper, platinum, palladium, tungsten, and a combination thereof.

26. The light emitting diode package of claim 1, wherein the light emitting diode package further comprises a first inorganic barrier layer between the organic barrier layer and the light conversion layer.

27. The light emitting diode package of claim 26, wherein the first inorganic barrier layer comprises a material selected from an inorganic oxide, an inorganic polymer, an organic/inorganic hybrid polymer, a polymer comprising a first monomer having at least two thiol groups at a terminal end and a second monomer or oligomer comprising a siloxane and having at least two carbon-carbon unsaturated bonds at a terminal end, and a combination thereof.

28. The light emitting diode package of claim 1, wherein the light emitting diode package further comprises a second inorganic barrier layer between the light-scattering structure and the light conversion layer.

29. The light emitting diode package of claim 28, wherein the second inorganic barrier layer comprises at least one material selected from an inorganic oxide, an inorganic polymer, an organic/inorganic hybrid polymer, a polymer comprising a first monomer having at least two thiol groups at a terminal end and a second monomer or oligomer comprising siloxane and having at least two carbon-carbon unsaturated bonds at a terminal end, and a combination thereof.

30. The light emitting diode package of claim 1, wherein the organic barrier layer has a moisture transmission rate of greater than or equal to about $10^{-3}$ gram per square meter per day and less than or equal to about $10^{-1}$ gram per square meter per day.

31. The light emitting diode package of claim 1, wherein the light emitting diode package has a beam angle of greater than or equal to about 120°.

32. A backlight unit for a liquid crystal display device comprising the light emitting diode package of claim 1.

33. The backlight unit of claim 32, wherein the backlight unit further comprises a diffusion plate on the light emitting diode package.

34. An illumination device comprising the light emitting diode package of claim 1.

35. A liquid crystal display device comprising:
the backlight unit of claim 32; and
a liquid crystal panel configured to provide an image using light emitted from the backlight unit.

36. A light emitting diode package comprising:
a light emitting diode;
a stack structure comprising,
a light-scattering structure spaced apart from the light emitting diode, and
a light conversion layer disposed on an inner surface of the light-scattering structure and filling a space inside of the light-scattering structure, and which is configured to convert light emitted from the light emitting diode into white light, wherein the light conversion layer comprises a semiconductor nanocrystal;
a first inorganic barrier layer under and in direct contact with the light conversion layer; and
a glass plate under the first inorganic barrier layer,
wherein the light emitting diode is disposed under a lower surface of the glass plate.

37. The light emitting diode package of claim 36, wherein the light emitting diode package further comprises an adhesive layer disposed between the first inorganic barrier layer and the glass plate.

38. The light emitting diode package of claim 36, wherein the light emitting diode package further comprises an organic barrier layer or an inorganic barrier layer on an outer surface of the light-scattering structure.

39. The light emitting diode package of claim 32, wherein the space is defined by the inner surface of the light-scattering structure and an upper surface of the first inorganic barrier layer.

* * * * *